(12) United States Patent
Gorodetsky et al.

(10) Patent No.: US 11,913,591 B2
(45) Date of Patent: Feb. 27, 2024

(54) COMPOSITE MATERIALS WITH ADJUSTABLE SPECTRAL PROPERTIES

(71) Applicant: The Regents of the University of California, Oakland, CA (US)

(72) Inventors: Alon A. Gorodetsky, Irvine, CA (US);
Steven R. Jim, Hillsboro, OR (US);
George Stiubianu, Iasi (RO); Erica Leung, Piedmont, CA (US); Kyle Naughton, Laguna Beach, CA (US);
Priyam Patel, Irvine, CA (US);
Maurizio Follador, Givoletto (IT);
Emil Karshalev, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 432 days.

(21) Appl. No.: 17/297,888

(22) PCT Filed: Nov. 27, 2019

(86) PCT No.: PCT/US2019/063772
§ 371 (c)(1),
(2) Date: May 27, 2021

(87) PCT Pub. No.: WO2020/113118
PCT Pub. Date: Jun. 4, 2020

(65) Prior Publication Data
US 2022/0003353 A1 Jan. 6, 2022

Related U.S. Application Data

(60) Provisional application No. 62/771,974, filed on Nov. 27, 2018.

(51) Int. Cl.
*F16L 59/08* (2006.01)
*B29C 41/00* (2006.01)
(Continued)

(52) U.S. Cl.
CPC ............ *F16L 59/08* (2013.01); *B29C 41/003* (2013.01); *B29C 41/04* (2013.01);
(Continued)

(58) Field of Classification Search
CPC ........ F16L 59/08; B29C 41/003; B29C 41/04; B29C 41/20; B29C 41/42; B29C 33/424;
(Continued)

(56) References Cited

U.S. PATENT DOCUMENTS 3,806,471 A 4/1974 Mitchell et al.
4,569,874 A 2/1986 Kuznetz
(Continued)

FOREIGN PATENT DOCUMENTS

EP 3765870 A1 1/2021
EP 3887147 A1 10/2021
(Continued)

OTHER PUBLICATIONS

Phan et al., "Reflectin as a Material for Neural Stem Cell Growth", Applied Materials and Interfaces, Dec. 24, 2015, vol. 8, pp. 278-284, DOI: 10.1021/acsami.5b08717.
(Continued)

*Primary Examiner* — David A Vanore

(57) ABSTRACT

Composite materials with adjustable spectral properties comprised of IR-reflecting micro-domains overlaying an IR-transparent elastomeric matrix, and capable of dynamically controlling IR radiation transmission are described, as well as methods of fabrication thereof. Systems with capabilities to regulate IR radiation (including heat) transmission based thereon, and methods of regulating IR radiation transmission (including thermal regulation) using the same are also provided.

24 Claims, 21 Drawing Sheets

(51) Int. Cl.
  *B29C 41/04* (2006.01)
  *C23C 14/00* (2006.01)
  *C23C 14/16* (2006.01)
  *C23C 14/30* (2006.01)
  *B29K 25/00* (2006.01)

(52) U.S. Cl.
  CPC .......... *C23C 14/0005* (2013.01); *C23C 14/16* (2013.01); *C23C 14/30* (2013.01); *B29K 2025/08* (2013.01)

(58) Field of Classification Search
  CPC ....... B29C 33/56; B29C 41/045; B29C 41/08; B29C 41/12; B29C 41/38; C23C 14/0005; C23C 14/16; C23C 14/30; B29K 2025/08; B32B 1/00; B32B 7/023; B32B 27/302; C08J 7/046; G02B 5/20
  See application file for complete search history.

(56) References Cited

U.S. PATENT DOCUMENTS

| | | | |
|---|---|---|---|
| 5,840,803 | A | 11/1998 | Chang et al. |
| 5,866,204 | A | 2/1999 | Robbie et al. |
| 6,004,494 | A | 12/1999 | Debe |
| 6,284,425 | B1 | 9/2001 | Hoffend et al. |
| 6,801,430 | B1 | 10/2004 | Pokharna et al. |
| 8,921,789 | B2 | 12/2014 | Pryce et al. |
| 10,018,831 | B2 | 7/2018 | Corbelli et al. |
| 10,035,175 | B2 * | 7/2018 | Gorodetsky .......... C09D 189/00 |
| 10,954,367 | B2 | 3/2021 | Zhou et al. |
| 11,565,970 | B1 * | 1/2023 | Shiao .................. C04B 20/1074 |
| 11,566,115 | B2 * | 1/2023 | Deravi ...................... C08K 3/22 |
| 11,650,098 | B2 * | 5/2023 | Cong .......................... G01J 1/56 356/445 |
| 2005/0249917 | A1 | 11/2005 | Trentacosta et al. |
| 2006/0197953 | A1 | 9/2006 | Perez et al. |
| 2009/0324976 | A1 | 12/2009 | Abu-salih et al. |
| 2010/0264353 | A1 | 10/2010 | Hartmann et al. |
| 2011/0164308 | A1 | 7/2011 | Arsenault et al. |
| 2011/0214221 | A1 | 9/2011 | Munda |
| 2012/0135448 | A1 * | 5/2012 | Parker .................. C12N 5/0068 435/398 |
| 2013/0222881 | A1 | 8/2013 | Aizenberg et al. |
| 2015/0329604 | A1 * | 11/2015 | Parker ...................... G02B 1/04 428/221 |
| 2015/0346398 | A1 * | 12/2015 | Gorodetsky ............. G02B 5/26 359/359 |
| 2016/0374411 | A1 | 12/2016 | Brooks et al. |
| 2017/0239930 | A1 | 8/2017 | Chandrasekaran et al. |
| 2021/0063612 | A1 | 3/2021 | Gorodetsky et al. |

FOREIGN PATENT DOCUMENTS

| | | |
|---|---|---|
| JP | 6257299 A | 3/1987 |
| JP | 2013003014 A | 1/2013 |
| JP | 2013524009 A | 6/2013 |
| JP | 2013540277 A | 10/2013 |
| JP | 2016102906 A | 6/2016 |
| JP | 2018027293 A | 2/2018 |
| JP | 2019521699 A | 8/2019 |
| JP | 2021518572 A | 8/2021 |
| WO | 2018016524 A1 | 1/2018 |
| WO | 2018031847 A1 | 2/2018 |
| WO | 2019178553 A1 | 9/2019 |
| WO | 2020113118 | 6/2020 |
| WO | 2023168460 A2 | 9/2023 |

OTHER PUBLICATIONS

Qin et al., "Bioinspired structural color sensors based on responsive soft materials", Current Opinion in Solid State Materials Science, Oct. 2018, 16 pgs., doi:10.1016/jcossms.2018.10.001.

Rahmani et al., "Reversible Thermal Tuning of All-Dielectric Metasurfaces", Advanced Functional Materials, Aug. 18, 2017, vol. 27, No. 31, 7 pgs., first published Jul. 3, 2017, doi: 10.1002/adfm.201700580.

Ramirez et al., "Eye-independent, light-activated chromatophore expansion (LACE) and expression of phototransduction genes in the skin of Octopus bimaculoides", The Journal of Experimental Biology, 2015, vol. 218, pp. 1513-1520.

Robbie et al., "First Thin Film Realization of a Helicoidal Bianisotropic Medium", Journal of Vacuum Science and Technology A, Nov./Dec. 1995, vol. 13, No. 6, pp. 2991-2993, http://dx.doi.org/10.1116/1.579626.

Rosset et al., "Flexible and stretchable electrodes for dielectric elastomer actuators", Applied Physics A., 2013, vol. 110, pp. 281-307, published online Nov. 7, 2012.

Rossiter et al., "Biomimetic chromatophores for camouflage and soft active surfaces", Bioinspiration & Biomimetics, May 1, 2012, vol. 7, 36009, pp. 1-10, doi: 10.1088/1748-3182/7/3/036009.

Rossiter et al., "Colour gamuts in polychromatic dielectric elastomer artificial chromatophores", Proc. SPIE., 2014, vol. 9056, pp. 905620-1-905620-8.

Sacadura, "Radiative heat transfer in fire safety science", Journal of Quantitative Spectroscopy & Radiative Transfer, 2005, vol. 93, pp. 5-24, doi: 1016/j.jqsrt.2004.0/.0111.

Sanborn, "Corps tests new camo the enemy won't be able to spot", Marine Corps Times, Apr. 12, 2015, Retrieved from the internet https://www.marinecorpstimes.com/news/your-marine-corps/2015/04/12/corps-tests-new-camo-the-enemy-won-t-be-able-to-spot/.

Schittny et al., "Experiments on Transformation Thermodynamics: Molding the Flow of Heat", Physical Review Letters, May 10, 2013, vol. 110, pp. 195901-1-195901-5.

Schwalm et al., "Infrared reflectance in leaf-sitting neotropical frogs", Science, Jun. 10, 1977, vol. 196, No. 4295, pp. 1225-1226.

Schwartzman et al., "The chemistry of negotiation: rhythmic, glycan-driven acidification in a symbiotic conversation", Proc Natl Acad Sci USA, Jan. 13, 2015, vol. 112, No. 2, pp. 566-571, doi: 10.1073/pnas.1418580112.

Shaddock et al., "Development of a Compliant Nanothermal Interface Material", Proceedings of the ASME 2011 Pacific Rim Technical Conference & Exposition on Packaging and Integration of Electronic and Photonic Systems, Inter PACK 2011, Jul. 6-8, 2011, IPACK2011-52015, pp. 1-5.

Singh et al., "Performance Comparison of Thermal Insulated Packaging Boxes, Bags and Refrigerants for Single-Parcel Shipments", Packaging Technology Science, 2008, vol. 21, pp. 25-35, published online Mar. 13, 2007, DOI: 10.1002/pts.773.

Skrabec, "Aluminum in America: A History", McFarland & Company, Inc., 2017, 16 pgs.

Stevens et al., "Temperature sensitivity of the body surface over the life span", Somatosensory & Motor Research, 1998, vol. 15, No. 1, pp. 13-28, published online Jul. 10, 2009, DOI: 10.1080/08990229870925.

Stoppa et al., "Wearable Electronics and Smart Textiles: A Critical Review", Sensors, Jul. 7, 2014, vol. 14, No. 7, pp. 11957-11992, doi: 10.3390/s140711957.

Suzuki et al., "Chromatophore activity during natural pattern expression by the squid Sepioteuthis lessoniana: contributions of miniature oscillation", PLoS One, Apr. 1, 2011, vol. 6, No. 4, e18244, pp. 1-8, doi: 10.1371/journal.pone.0018244.

Tao et al., "The role of protein assembly in dynamically tunable bio-optical tissues", Biomaterials, Feb. 2010, vol. 31, No. 5, pp. 793-801, available online Nov. 10, 2009, doi: 10.1016/j.biomaterials.2009.10.038.

Taschuk et al., "Glancing Angle Deposition", In Handbook of Deposition Technologies for Films and Coatings: Science, Applications and Technology; Martin, P., Ed.; William Andrew (Elsevier): Oxford, United Kingdom, 2010; pp. 621-678.

Tian et al., "A comprehensive study of electrochromic device with variable infrared emissivity based on polyaniline conducting polymer", Solar Energy Materials and Solar Cells, May 21, 2017, vol. 170, pp. 120-126.

(56) References Cited

OTHER PUBLICATIONS

Tiwari et al., "Concise Encyclopedia of High Performance Silicones", John Wiley & Sons, Inc.: Hoboken, NJ, USA, 2014, 406 pgs., (presented in 5 parts).

Tong et al., "Advanced Materials for Thermal Management of Electronic Packaging", Springer, New York, 2011, (presented in two parts).

Tong et al., "Infrared-transparent visible-opaque fabrics for wearable personal thermal management", ACS Photonics, May 29, 2015, vol. 2, pp. 769-778, doi: 10.1021/acsphotonics.5b00140.

Tsui et al., "Polymer Thin Films", 1st ed., Series in Soft Condensed Matter; World Scientific Publishing Co. Pte. Ltd.: Singapore, 2008; vol. 1, 312 pgs., (presented in three parts).

Urge-Vorsatz et al., "Heating and cooling energy trends and drivers in buildings", Renewable and Sustainable Energy Reviews, Jan. 2015, vol. 41, pp. 85-98, available online Sep. 6, 2014, doi: 10.1016/j.rser.2014.08.039.

Vignolini et al., "Pointillist structural color in Pollia fruit", Proceedings of the National Academy of Sciences of USA, Sep. 25, 2012, vol. 109, No. 39, pp. 15712-15715, doi: 10.1073/pnas.1210105109.

Wake et al., "Formulating Infrared Coatings for Defence Applications", U.S. Defense Technical Information Center, 1993, 37 pgs.

Wang et al., "A state of art review on methodologies for heat transfer and energy flow characteristics of the active building envelopes", Renewable and Sustainable Energy Reviews, Oct. 2017, vol. 78, pp. 1102-1116, doi: 10.1016/j.rser.2017.05.015, available online May 15, 2017.

Wang et al., "Cephalopod-inspired design of electro-mechano-chemically responsive elastomers for on-demand fluorescent patterning", Nature Communications, Sep. 16, 2014, vol. 5, No. 4899, pp. 1-9, DOI: 10.1038/ncomms5899.

Wang et al., "Switchable Materials for Smart Windows", Annual Review of Chemical and Biomolecular Engineering, Jun. 2016, vol. 7, pp. 283-304, Published Online Mar. 23, 2016, doi: 10.1146/annurev-chembioeng-080615-034647.

Wardill et al., "Neural control of tuneable skin iridescence in squid", Proceedings of the Royal Society B, Jul. 25, 2012, vol. 279, pp. 4243-4252.

Watkins et al., "Functional Clothing Design: From Sportswear to Spacesuits", Fairchild Books, New York, 2015, 9 pgs.

Wehmeyer et al., "Thermal diodes, regulators, and switches: physical mechanisms and potential applications", Applied Physics Reviews, Nov. 21, 2017, vol. 4, pp. 041304-1-041304-32, doi: 10.1063/1.5001072.

Wier et al., "Transcriptional patterns in both host and bacterium underlie a daily rhythm of anatomical and metabolic change in a beneficial symbiosis", Proc Natl Acad Sci USA, Feb. 2, 2010, vol. 107, No. 5, pp. 2259-2264, doi: 10.1073/pnas.0909712107.

Winterhalter, "Military Update", US Army Natick Soldier Research, Development and Engineering Center, Jun. 2015, Retrieved from the internet https://www.ifai.com/wp-content/uploads/2015/06/Winterhalter-Carole_Outlook-2015.pdf.

Wood et al., "Do larger cephalopods live longer? Effects of temperature and phylogeny on interspecific comparisons of age and size at maturity", Marine Biology, 2000, vol. 136, pp. 91-99.

Xiao et al., "Fast Adaptive Thermal Camouflage Based on Flexible VO2/Graphene/CNT Thin Films", Nano Letters, Nov. 24, 2015, vol. 15, pp. 8365-8370.

Xu et al., "Adaptive infrared-reflecting systems inspired by cephalopods", Science, Mar. 30, 2018, vol. 359, No. 6383, pp. 1495-1500, doi: 10.1126/science.aar5191.

Xu et al., "Stretchable Cephalopod-Inspired Multimodal Camouflage Systems", Advanced Materials, Mar. 4, 2020, vol. 32, 1905717, doi: 10.1002/adma.201905717.

Yu et al., "Adaptive optoelectronic camouflage systems with designs inspired by cephalopod skins", PNAS, Sep. 9, 2014, vol. 111, No. 36, pp. 12998-13003, www.pnas.org/cgi/doi/10/1073/pnas.1410494111.

Zhao et al., "Recent developments of truly stretchable thin film electronic and optoelectronic devices", Nanoscale, Feb. 19, 2018, vol. 10, No. 13, pp. 5764-5792, DOI: 10.1039/c7nr09472h.

Extended European Search Report for European Application No. 19768064.8, Search completed Mar. 9, 2022, dated Mar. 17, 2022, 11 Pgs.

Li et al., Phononics: manipulating heat flow with electronic analogs and beyond, Rev. Mod. Phys., Mar. 5, 2012, vol. 84, pp. 1045-1066, doi: 10.1103/RevModPhys.84.1045.

Chen et al., "Electronic Muscles and Skins: A Review of Soft Sensors and Actuators", Chemical Reviews, Aug. 17, 2017, vol. 117, No. 17, pp. 11239-11268, doi: 10.1021/acs.chemrev.7b00019.

Choi et al., "Structure-property relationship in sulfonated pentablock copolymers", Journal of Membrane Science, Mar. 15, 2012, vol. 394-395, pp. 169-174, doi:10.1016/j.memsci.201.120.36.

Cloney et al., "Chromatophore Organs, Reflector Cells, Iridocytes and Leucophores in Cephalopods", American Zoologist, 1983, vol. 23, No. 3, pp. 581-592.

Coppens et al., "Spatial and Temporal Modulation of Thermal Emission", Advanced Materials, Aug. 21, 2017, vol. 29, 1701275, 6 pgs., doi: 10.1002/ADMA.201701275.

Crookes et al., "Reflectins: the unusual proteins of squid reflective tissues", Science, Jan. 9, 2004, vol. 303, pp. 235-238.

Decher et al., "Multilayer Thin Films", Wiley-VCH Verlag Gmbh & Co. KGaA: Weinheim, Germany, 2012, 1100 pgs., (presented in 12 parts).

Demartini et al., "Membrane invaginations facilitate reversible water flux driving tunable iridescence in a dynamic biophotonic system", PNAS, Feb. 12, 2013, vol. 110, No. 7, pp. 2552-2556, https://doi.org/10.1073/pnas.1217260110.

Demartini et al., "Structures, Organization, and Function of Reflectin Proteins in Dynamically Tunable Reflective Cells", Journal of Biological Chemistry, Jun. 12, 2015, vol. 290, No. 24, pp. 15238-15249, first published Apr. 26, 2015, DOI: 10.1074/JBC.m115.638254.

Deravi et al., "The structure-function relationships of a natural nanoscale photonic device in cuttlefish chromatophores", Journal of the Royal Society Interface, Jan. 7, 2014, vol. 11, 20130942, 9 pgs., http://dx.doi.org/10.1098/rsif.2013.0942.

Dipirro et al., "Heat switches for ADRs", Cryogenics, Jul.-Aug. 2014, vol. 62, pp. 172-176, available online Apr. 5, 2014, doi: 10.1016/j.cryogenics.2014.03.017.

Drobny, "Handbook of Thermoplastic Elastomers", Elsevier Oxford, ed. 2, 2014, 425 pgs. (presented in two parts).

Fan et al., "Structure, physical properties, and molecule transport of gas, liquid, and ions within a pentablock copolymer", Journal of Membrane Science, 2014, vol. 464, pp. 179-187, available online Apr. 14, 2014.

Geetha et al., "EMI shielding: Methods and materials—A review", Journal of Applied Polymer Science, Feb. 13, 2009, vol. 112, pp. 2073-2086, DOI: 10.1002/app.29812.

Gonzalez, "Watch what happens when you play Cypress Hill through a squid's fin", Aug. 23, 2012, Retrieved from the internet https://io9.gizmodo.com/5937406/watch-what-happens-when-you-play-cypress-hill-through-a-squids-fin.

Gupta et al., "Review of passive heating/cooling systems of buildings", Energy Science & Engineering, Oct. 6, 2016, vol. 4, No. 5, pp. 305-333, doi: 10.1002/ese3.129.

Hammock et al., "25th Anniversary Article: The Evolution of Electronic Skin (E-Skin): A Brief History, Design Considerations, and Recent Progress", Advanced Materials, Nov. 13, 2013, vol. 25, No. 42, pp. 5997-6038, DOI: 10.1002/adma.201302240.

Han et al., "Full Control and Manipulation of Heat Signatures: Cloaking, Camouflage and Thermal Metamaterials", Advanced Materials, Feb. 5, 2014, vol. 26, pp. 1731-1734.

Hanlon, "Cephalopod dynamic camouflage", Current Biology, 2007, vol. 17, No. 11, pp. R400-R404.

Hanssen et al., "Infrared Optical Properties of Materials", NIST Special Publication 250-94, Feb. 2015, 171 pgs., http://dx.doi.org/10.6028NIST.SP.250-94.

Hawkeye et al., "Glancing Angle Deposition of Thin Films", John Wiley & Sons, Ltd: Chichester, UK, 2014, 307 pgs. (presented in two parts).

(56) References Cited

OTHER PUBLICATIONS

Hawkeye et al., "Glancing Angle Deposition: Fabrication, Properties, and Applications of Micro- and Nanostructured Thin Films", Journal of Vacuum Science & Technology A, Sep./Oct. 2007, vol. 25, No. 5, pp. 1317-1335, first published Jul. 30, 2007, https://doi.org/10.1116/1.2764082.

Haynes, "Digital Infrared Capture & Workflow", Dec. 21, 2008, Retrieved from the internet http://www.crhfoto.co.uk/crh/digital%20infra-red/digital-ir.htm.

Hernandez-Perez et al., "Thermal performance of reflective materials applied to exterior building components—A review", Energy and Buildings, Sep. 2014, vol. 80, pp. 81-105, available online May 15, 2014, doi: 10.1016/j.enbuild.2014.05.008.

Hsu et al., "Radiative human body cooling by nanoporous polyethylene textile", Science, Sep. 2, 2016, vol. 353, Issue 6303, pp. 1019-1023, doi: 10.1126/science.aaf5471.

Iglesias, "Cephalopod culture", Springer, 2014, 493 pgs., http://www.springer.com/us/book/9789401786478. (presented in four parts).

Ji et al., "Infrared thermochromic properties of monoclinic VO2 nanopowders using a malic acid-assisted hydrothermal method for adaptive camouflage", RSC Advances, Jan. 4, 2017, vol. 7, pp. 5189-5194.

John et al., "Peri-operative warming devices: performance and clinical application", Anaesthesia, Jun. 2014, vol. 69, pp. 623-638, doi: 10.1111/anae.12626.

Jones, "Sci-fi and Jurassic Park have driven research, scientists say", The Conversation, Jun. 10, 2015, Retrieved from the internet https://theconversation.com/sci-fi-and-jurassic-park-have-driven-research-scientists-say-42864.

Kakaç et al., "Microscale Heat Transfer—Fundamentals and Applications", NATO Science Series, II Mathematics, Physics and Chemistry, vol. 103, Springer, 2005, 517 pgs. (presented in three parts).

Kanai et al., "Film Processing", Hanser Publications: Munich, 2011, 474 pgs. (presented in two parts).

Kats et al., "Vanadium Dioxide as a Natural Disordered Metamaterial: Perfect Thermal Emission and Large Broadband Negative Differential Thermal Emittance", Physical Review X., Oct. 21, 2013, vol. 3, 41004, 7 pgs.

Kautz et al., "Cephalopod-Derived Biopolymers for Ionic and Protonic Transistors", Advanced Materials, May 2018, vol. 30, No. 19, e1704917, 15 pgs., doi: 10.1002/adma.201704917.

Kikuchi et al., "Distributed cogeneration of power and heat within an energy management strategy for mitigating fossil fuel consumption", Journal of Industrial Ecology, Dec. 16, 2015, vol. 20, No. 2, pp. 289-303, doi: 10.1111/jiec.12374.

Kim et al., "Patternable PEDOT nanofilms with grid electrodes for transparent electrochromic devices targeting thermal camouflage", Nano Convergence, 2015, vol. 2, No. 19, 7 pgs., published online Oct. 1, 2015, DOI 10.1186/s40580-015-0051-9.

Kirkwood et al., "Mechanics of the cephalopod chromatophore layer: Structural characterization of cephalopod chromatophores", Proceedings of the ASME 2011 Summer Bioengineering Conference, Jun. 22-25, 2011, Farmington, Pennsylvania, USA, 2 pgs.

Kolle et al., "Progress and Opportunities in Soft Photonics and Biologically Inspired Optics", Advanced Materials, Jan. 11, 2018, First Published Oct. 23, 2017, vol. 30, No. 2, 1702669, doi: 10.1002/adma.201702669.

Kramer et al., "The self-organizing properties of squid reflectin protein", Nature Materials, Jul. 2007, vol. 6, No. 7, pp. 533-538, published online Jun. 3, 2007, doi:10.1038/nmat1930.

Kreit et al., "Biological versus electronic adaptive coloration: how can one inform the other?", Journal of the Royal Society Interface, 2013, Jun. 1, 2012, pp. 1-13, http://dx.doi.org10.1098/rsif.2012.0601.

Larson et al., "Highly stretchable electroluminescent skin for optical signaling and tactile sensing", Science, Mar. 4, 2016, vol. 351, Issue 6277, pp. 1071-1074.

Lee et al., "Proton Conduction in a Tyrosine-Rich Peptide/Manganese Oxide Hybrid Nanofilm", Advanced Functional Materials, Sep. 20, 2017, vol. 27, No. 35, 1702185, 9 pgs., doi: 10.1002/adfm.201702185.

Leung et al., "A dynamic thermoregulatory material inspired by squid skin", Nature Communications, 2019, vol. 10, No. 1947, pp. 1-10, https://doi.org/10.1038/s41467-019-09589-w.

Levenson et al., "Cyclable Condensation and Hierarchical Assembly of Metastable Reflectin Proteins, the Drivers of Tunable Biophotonics", Journal of Biological Chemistry, Feb. 19, 2016, vol. 291, No. 8, pp. 4058-4068, doi: 10.1074/jbc.M115.686014.

Li et al., "Colloquium: Phononics: Manipulating heat flow with electronic analogs and beyond", Review of Modern Physics, Jul.-Sep. 2012, vol. 84, pp. 1045-1066, DOI: 10.1103/RevModPhys.84.1045.

Liu et al., "Thermochromic properties of W-doped VO2 thin films deposited by aqueous sol-gel method for adaptive infrared stealth application", Infrared Physics & Technology, Jun. 17, 2016, vol. 77, pp. 339-343.

Mao et al., "Infrared stealth property based on semiconductor (M)-to-metallic (R) phase transition characteristics of W-doped VO2 thin films coated on cotton fabrics", Thin Solid Films, Feb. 20, 2014, vol. 558, pp. 208-214.

Mark et al., "Polymer Data Handbook", Oxford University Press, ed. 2, 2009, 1102 pgs. (presented in two parts).

Mathger et al., "Bright White Scattering from Protein Spheres in Color Changing, Flexible Cuttlefish Skin", Advanced Functional Materials, Aug. 26, 2013, vol. 23, No. 32, pp. 3980-3989, doi: 10.1002/adfm.201203705.

Mathger et al., "Malleable skin coloration in cephalopods: selective reflectance, transmission and absorbance of light by chromatophores and iridophores", Cell Tissue Res, Apr. 5, 2007, vol. 329, pp. 179-186.

Mathger et al., "Mechanisms and behavioural functions of structural coloration in cephalopods", J. R. Soc. Interfac, 2009, vol. 6, pp. S149-S163, published online Dec. 15, 2008, doi: 10.1098/rsif.2008.0366.focus.

McCoul et al., "Recent Advances in Stretchable and Transparent Electronic Materials", Advanced Electronic Materials, Mar. 16, 2016, vol. 2, 1500407, 51 pgs.

McFall-Ngai et al., "Divining the Essence of Symbiosis: Insights from the Squid-Vibrio Model", PLoS Biology, Feb. 4, 2014, vol. 12, No. 2, e1001783, doi: 10.1371/journal.pbio.1001783.

Messenger, "Cephalopod chromatophores: neurobiology and natural history", Biol. Rev., 2001, vol. 76, pp. 473-528, DOI: 10.1017/S1464793101005772.

Meyer, "Elements of Space Technology", Elsevier, 1999, 346 pgs.

Moore et al., "Emerging challenges and materials for thermal management of electronics", Materials Today, May 2014, vol. 17, No. 4, pp. 163-174, doi: 10.1016/j.mattod.2014.04.003.

Morin et al., "Camouflage and Display for Soft Machines", Science, Aug. 17, 2012, vol. 337, pp. 828-832.

Munteanu et al., "Spectral and thermal characterization of styrene-butadiene copolymers with different architectures", Journal of Optoelectronics and Advanced Materials, Dec. 2005, vol. 7, No. 6, pp. 3135-3148.

NASA, "Reflecting on Space Benefits: A Shining Example", NASA Spinoff, 2006, pp. 56-61.

Naughton et al., "Self-Assembly of the Cephalopod Protein Reflectin", Advanced Materials, Oct. 12, 2016, vol. 28, No. 38, pp. 8405-8412, doi: 10.1002/adma.201601666.

Nieuwenhuizen et al., "Microfractography of Thin Films", Philips Tech. Rev. 1966, vol. 27, No. 3-4, pp. 87-91.

O'Dor et al., "Nutrient absorption, storage and remobilization in octopus vulgaris", Marine & Freshwater Behaviour & Physiol., 1984, vol. 11, pp. 239-258, published online Jan. 22, 2009.

Ordinario et al., "Bulk protonic conductivity in a cephalopod structural protein", Nature Chemistry, Jul. 2014, vol. 6, pp. 596-602, published online Jun. 1, 2014, doi: 10.1038/nchem.1960.

Ordinario et al., "Photochemical Doping of Protonic Transistors from a Cephalopod Protein", Chemistry of Materials, May 23, 2016, vol. 28, pp. 3703-3710, doi: 10.1021/acs.chemmater.6b00336.

(56) References Cited

OTHER PUBLICATIONS

Ordinario et al., "Production and electrical characterization of the reflectin A2 isoform from Doryteuthis (Loligo) pealeii", RSC Advances, 2016, vol. 6, pp. 57103-57107, doi: 10.1039/c6ra05405f.

Ordinario et al., "Protochromic Devices from a Cephalopod Structural Protein", Advanced Optical Materials, Oct. 16, 2017, vol. 5, No. 20, 1600751, pp. 1-6, doi: 10.1002/adom.201600751.

Ordinario et al., "Protonic transistors from thin reflectin films", Apl. Materials, 2015, vol. 3, Issue 1, pp. 014907-1-014907-6, published online Nov. 18, 2014, doi: 10.1063/1.4901296.

Phan et al., "Dynamic Materials Inspired by Cephalopods", Chemistry of Materials, Sep. 21, 2016, vol. 28, pp. 6804-6816, doi: 10.1021/acs.chemmater.6b01532.

Phan et al., "Infrared invisibility stickers inspired by cephalopods", Journal of Materials Chemistry C, 2015, vol. 3, Issue 25, pp. 6493-6498, first published Feb. 19, 2015, doi: 10.1039/c5tc00125k.

Phan et al., "Reconfigurable infrared camouflage coatings from a cephalopod protein", Advanced Materials, Jul. 30, 2013, vol. 25, pp. 5621-5625, doi: 10.1002/adma201301472.

International Preliminary Report on Patentability for International Application PCT/US2019/022600, Report dated Sep. 15, 2020, dated Sep. 24, 2020, 12 Pgs.

International Preliminary Report on Patentability for International Application PCT/US2019/063772, Report dated May 25, 2021, dated Jun. 10, 2021, 8 Pgs.

International Search Report and Written Opinion for International Application No. PCT/US2019/022600, Search completed May 3, 2019, dated May 23, 2019, 18 Pgs.

International Search Report and Written Opinion for International Application PCT/US2019/063772, Report Completed on Feb. 28, 2020, dated Mar. 12, 2020, 12 pgs.

Partial European Search Report for European Application No. 19768064.8, Search completed Nov. 4, 2021, dated Nov. 15, 2021, 11 Pgs.

U.S. Department of Energy, Energy-Efficient Windows, https://energy.gov/energysaver/energy-efficient-windows, 8 pgs.

"DELTA Kickoff Meeting", arpa-e, May 21-22, 2015, Retrieved from the internet http://arpa-e.energy.gov/?q=site-page/delta-kickoff-meeting, 2 pgs.

"Energy Efficient, Year-round Comfort in Any Climate", Mitsubishi Electric, Sep. 29, 2016, Retrieved from the interney http://www.mitsubishicomfort.com/sites/default/files/manual/fh-series_highrise_brochure.pdf?fid=1156, 4 pgs.

"Energy Technology Perspectives 2017", International Energy Agency, doi: 10.1787/energy_tech-2017-en, ISBN: 9789264275973, 443 pgs. (presented in two parts).

"Giant Australian cuttlefish (*Sepia apama*)", Wildscreen Arkive, 2018, Retrieved from the Internet https://www.arkive.org/giant-australian-cuttlefish/sepia-apama/image-G68546.html on Nov. 6, 2018.

"Office of the Assistant Secretary of Defense for Energy, Installations, and Environment", Department of Defense Annual Energy Management and Resilience (AEMR) Report Fiscal Year 2016, Jul. 2017, https://www.acq.osd.mil/eie/Downloads/IE/FY%202016%20AEMR.pdf, 94 pgs.

"Standard Test Method for Tensile Properties of Thin Plastic Sheeting", ASTM Standard D882, ASTM International, 2012, pp. 1-12.

"Structural coloration", Wikipedia, Wikimedia Foundation, Nov. 23, 2018, Retrieved from https://en.wikipedia.org/wiki/Structural_coloration, 11 pgs.

"Thermocomfort Cloth", arpa-e, Dec. 16, 2014, Retrieved from the internet https://arpa-e.energy.gov/?q=slick-sheet-project/thermocomfort-cloth.

Ahlers, "Aircraft Thermal Management", Encyclopedia of Aerospace Engineering, John Wiley & Sons, 2011, pp. 1-13, doi: 10.1002/9780470686652.

Akbari et al., "Microfabrication and characterization of an array of dielectric elastomer actuators generating uniaxial strain to stretch individual cells", Journal of Micromechanics and Microengineering, Mar. 19, 2012, vol. 22, pp. 1-12, doi:10.1088/0960-1317/22/4/045020.

Albertin et al., "Advances in Marine Biology", Elsevier, vol. 67, 2014, 479 pgs. (presented in two parts).

Allen et al., "Degradation and stabilisation of styrene-ethylene-butadiene-styrene (SEBS) block copolymer", Polymer Degradation and Stability, 2000, vol. 71, pp. 113-122, doi: 10.1016/S0141-3910(00)00162-2.

Arpa, "DELTA Program Overview", U.S. Department of Energy Advanced Research Projects Agency, 2014, 16 pgs.

ASTM International, "Standard Test Method for Thermal and Evaporative Resistance of Clothing Materials Using a Sweating Hot Plate", ASTM Standard F1868, ASTM International, 2017, pp. 1-9.

Bao et al., "Flexible and Stretchable Devices", Advanced Materials, Jun. 8, 2016, vol. 28, No. 22, pp. 4177-4179, doi: 10.1002/adma.201601422.

Barranco et al., "Perspectives on oblique angle deposition of thin films: from fundamentals to devices", Progress in Materials Science, Mar. 2016, vol. 76, pp. 59-153, available online Aug. 28, 2015, doi: 10.1016/j.pmatsci.2015.06.003.

Bell et al., "Chromatophore radial muscle fibers anchor in flexible squid skin", Invertebrate Biology, Jun. 2013, vol. 132, No. 2, pp. 120-132, doi: 10.1111/ivb.12016.

Benslimane et al., "Dielectric Elastomers as Electromechanical Transducers", Jan. 22, 2008, Elsevier Science, 334 pgs. (presented in two parts).

Biggs et al., "Electroactive Polymers: Developments of and Perspectives for Dielectric Elastomers", Angew. Chemie Int. Ed., Jul. 22, 2013, vol. 52, pp. 9409-9421.

Boen, "A Shining Example of Space Benefits", NASA, Nov. 30, 2007, Retrieved from https://www.nasa.gov/vision/earth/technologies/silver_insulation.html, 2 pgs.

Cai et al., "Warming up human body by nanoporous metallized polyethylene textile", Nature Communications, Sep. 19, 2017, vol. 8, No. 496, pp. 1-8, doi: 10.1038/s41467-017-00614-4.

Carpi, "Electromechanically Active Polymers", Springer, 2016, 795 pgs. (presented in four parts).

Casini, "Active dynamic windows for buildings: A review", Renewable Energy, Apr. 2018, vol. 119, pp. 923-934, doi: 10.1016/j.renene.2017.12.049.

Chandrasekhar et al., "Conducting Polymer (CP) infrared electrochromics in spacecraft thermal control and military applications", Synthetic Metals, 2003, vol. 135-136, pp. 23-24, DOI: 10.1016/S0379-6779(02)00682-3.

Chandrasekhar et al., "Large, Switchable Electrochromism in the Visible Through Far-Infrared in Conducting Polymer Devices", Advanced Functional Materials, Feb. 2002, vol. 12, pp. 95-103, DOI: 10.1002/1616-3028(20020201)12:2<95::AID-ADFM95>3.0.CO;2-N.

Extended European Search Report for European Application No. 19889543.5, Search completed Jun. 24, 2022, dated Jul. 4, 2022, 06 Pgs.

"Coffee Market—Growth-Trends, COVID-19 Impact, and Forecasts (2021-2026)", Research and Markets; https://www.researchandmarkets.com/reports/5165416/coffee-market-growth-trends-covid-19-impact.

"U.S. Coffee Statistics", 2020/2021; Urban Bean Coffee; 2021, https://urbanbeancoffee.com/coffee/USA-coffee-statistics.

Abraham et al., "A Review of Hot Beverage Temperatures-Satisfying Consumer Preference and Safety", Journal of Food Science, vol. 84, No. 8, Aug. 2019, first published Jul. 11, 2019, pp. 2011-2014. doi: 10.1111/1750-3841.14699.

Alberghini, "Sustainable polyethylene fabrics with engineered moisture transport for passive cooling", Nature Sustainability, vol. 4, pp. 715-724, https://doi.org/10.1038/s41893-021-00688-5.

Anukiruthika et al., "Multilayer packaging: Advances in preparation techniques and emerging food applications", Comprehensive Reviews in Food Science & Food Safety, vol. 19, No. 3, May 2020, published online Apr. 20, 2020, pp. 1156-1186. doi: 10.1111/1541-4337.12556.

Bader, "Selection of composite materials and manufacturing routes for cost-effective performance", Composites Part A: Applied Science and Manufacturing, vol. 33, Issue 7, Jul. 1, 2002, pp. 913-934, https://doi.org/10.1016/S1359-835X(02)00044-1.

(56) References Cited

OTHER PUBLICATIONS

Bayus et al., "A preliminary environmental assessment of foil and metallized film centered laminates", Resources, Conservation and Recycling, vol. 115, Dec. 2016, pp. 31-41, https://doi.org/10.1016/j.resconrec.2016.08.024.

Bishop et al., "Vacuum metallizing for flexible packaging", Multilayer Flexible Packaging (Second Edition), Plastics Design Library, 2016, pp. 235-255, https://doi.org/10.1016/B978-0-323-37100-1.00015-6.

Borysiak et al., "Simple replica micromolding of biocompatible styrenic elastomers", Lab on a Chip, vol. 13, 2013, pp. 2773-2785, doi: 10.1039/c3lc50426c.

Brown et al., "Calculating the optimum temperature for serving hot beverages", Burns, vol. 34, No. 5, Aug. 2008, first published Jan. 15, 2008, pp. 648-654, doi: 10.1016/j.burns.2007.09.012.

Centea et al., "Manufacturing cost relationships for vacuum bag-only prepreg processing", Journal of Composite Materials, vol. 50, 2015, pp. 2305-2325, doi: 10.1177/0021998315602949.

Chadwick et al., "Hypothermia and the use of space blankets: a literature review", Accident and Emergency Nursing, vol. 3, No. 3, Jul. 1997, available online Mar. 22, 1997, pp. 122-125, doi: 10.1016/s0965-2302(97)90001-1.

Chang et al., "An investigation into reusable coffee mugs", University of British Columbia, 2011; 33 pgs., https://doi.org/10.14288/1.0108413.

Changwichan et al., "Choice of materials for takeaway beverage cups towards a circular economy", Sustainable Production and Consumption, vol. 22, Apr. 2020, pp. https://doi.org/10.1016/j.spc.2020.02.004.

Choi et al., "Extraction of chromium, copper, and arsenic from CCA-treated wood by using wood vinegar", Bioresource Technology, vol. 120, Sep. 2012, pp. 328-331, https://doi.org/10.1016/j.biortech.2012.06.045.

Decker et al., "Metallized-Polymer-Films-as-Replacement-for-Aluminum-Foil-in-Packaging-Applications", Conference: Society of Vacuum Coaters 47th Annual Technical Conference, Apr. 2004, pp. 594-599.

Deshwal et al., "Review on metal packaging: materials, forms, food applications, safety and recyclability", Food Science Technology, vol. 57, No. 7, Jul. 2020, published online Nov. 12, 2019, pp. 2377-2392, doi: 10.1007/s13197-019-04172-z.

Dou et al., "Bioinspired Microstructured Materials for Optical and Thermal Regulation", Advanced Materials, Feb. 2021, 29 pgs., DOI: 10.1002/adma.202000697.

El-Kady et al., "Occurrence of trace metals in foodstuffs and their health impact", Trends in Food Science & Technology, vol. 75, May 2018, pp. 36-45, https://doi.org/10.1016/j.tifs.2018.03.001.

Epa, "Antimicrobial Copper Alloys—Group I and Associated Fabricated Products Master Label", EPA, 2014, https://www.3.epa.gov/pesticides/chem_search/ppl./082012-00001-20210110.pdf.

Esawi et al., "Cost estimates to guide pre-selection of processes", Materials & Design, vol. 24, Issue 8, Dec. 2003, pp. 605-616, https://doi.org/10.1016/S0261-3069(03)00136-5.

Foteinis, "How small daily choices play a huge role in climate change: The disposable paper cup environmental bane", Journal of Cleaner Production, vol. 255, May 10, 2020, 120294, https://doi.org/10.1016/j.jclepro.2020.120294.

Fu et al., "Antimicrobial-coated films as food packaging: A review", Comprehensive Review in Food Science and Food Safety, vol. 20, No. 4, Jul. 2021, published online May 30, 2021, pp. 3404-3437, doi: 10.1111/1541-4337.12769.

Han, "Innovations in Food Packaging", Elsevier 2013, https://doi.org/10.1016/C2011-0-06876-X.

Hanlon et al., "Cephalopod Behaviour", Cambridge University Press, 2018. (presented in 2 parts).

Hu et al., "Emerging Materials and Strategies for Personal Thermal Management", Advanced Energy Materials, vol. 10, Issue 17, May 5, 2020, first published Mar. 20, 2020, 1903921, https://doi.org/10.1002/aenm.201903921.

IHS Markit, "Specialty Plastic Films—Process Economic Program Report 159B (updated economic values", https://ihsmarkit.com/products/chemical-technology-pep-specialty-plastic-films-1993.html, 1993.

Kaiser et a l., "Recycling of Polymer-Based Multilayer Packaging: A Review", Recycling, vol. 3, No. 1; 2018, 26 pgs., doi:10.3390/recycling3010001.

Kosky et al., "Exploring Engineering: An Introduction to Engineering and Design", Academic Press, 2015.

Kranebitter et al., "Rescue Blankets—Transmission and Reflectivity of Electromagnetic Radiation", Coatings, vol. 10, No. 4, Apr. 2020, 375, DOI: 10.3390/coatings10040375.

Lavrykov et al., "Thermal Properties of Paper Sheets", Mar. 2012Drying Technology, vol. 30, No. 3, pp. 297-311, DOI:10.1080/07373937.2011.638148.

Lee et al., "At What Temperatures Do Consumers Like to Drink Coffee?: Mixing Methods", Journal of Food Science, vol. 67, Issue 2, Sep. 2002, first published Jul. 20, 2006, pp. 2774-2777, https://doi.org/10.1111/j.1365-2621.2002.tb08814.x.

Matthews et al., "A review on European Union's strategy for plastics in a circular economy and its impact on food safety", Journal of Cleaner Production, vol. 283, Feb. 10, 2021, 125263, https://doi.org/10.1016/j.jclepro.2020.125263.

Mbam et al., "Thin-film coating; historical evolution, conventional deposition technologies, stress-state micro/nano-level measurement/models and prospects projection: a critical review", Materials Research Express, vol. 6, 122001, 2019, doi: 10.1088/2053-1591/ab52cd.

National Research Council, "Copper in Drinking Water", National Research Council 2000, . Copper in Drinking Water. Washington, DC: The National Academies Press, 162 pgs, https://doi.org/10.17226/9782.

Perry et al., "Development of Packaging and Products for Use in Microwave Ovens", Elsevier, 2020, pp. 261-291, https://doi.org/10.1016/B978-0-08-102713-4.00008-6.

Piergiovanni et al., "The protective effect of film metallization against oxidative deterioration and discoloration of sensitive foods", Packaging Technology and Science, vol. 17, Issue 3, May/Jun. 2004, first published May 25, 2004, pp. 155-164, https://doi.org/10.1002/pts.651.

Powell et al., "Thermal Conductivity of Selected Materials", NSRDS-NBS 8 National Standard Reference Data Series—National Bureau of Standards—8, 1966, 220 pgs.

Pramudya et al., "Bitter Touch": Cross-modal associations between hand-feel touch and gustatory cues in the context of coffee consumption experience, Food Quality and Preference, vol. 83, Jul. 2020, 103914, https://doi.org/10.1016/j.foodqual.2020.103914.

Prohaska, , "Impact of copper deficiency in humans", Annals of the New York Academy of Sciences, vol. 1314, Issue 1, May 2014, published online Feb. 12, 2014, pp. 1-5. doi: 10.1111/nyas.12354.

Rai et al., "A Review on Recent Advances in Electrochromic Devices: A Material Approach", Advanced Engineering Materials, vol. 22, Issue 8, Aug. 2020, first published May 28, 2020, 2000082, 24 pgs, https://doi.org/10.1002/adem.202000082.

Ramos et al., "New Trends in Beverage Packaging Systems: A Review", Beverages, vol. 1, 2015, pp. 248-272; doi:10.3390/beverages1040248.

Rehm et al., "Coffee Consumption among Adults in the United States by Demographic Variables and Purchase Location: Analyses of NHANES 2011—2016 Data", Nutrients, 12, 2463, 2020, 13 pgs., doi:10.3390/nu12082463.

Roberston, "Food Packaging", CRC Press, 2016, doi: 10.1201/b21347.

Saba et al., "Biopolymers and Biocomposites from Agro-Waste for Packaging Applications", Elsevier, 2021, doi:10.1016/C2019-0-00969-7.

Salah, "Copper as an antimicrobial agent: recent advances", Royal Society of Chemistry Advances, vol. 11, 2021, pp. 18179-18186, DOI: 10.1039/d1ra02149d.

Santos, "An Unashamed Defense of Coffee", Xlibris, 2009.

Shen et al., "Mass-produced SEBS/graphite nanoplatelet composites with a segregated structure for highly stretchable and recyclable

(56) References Cited

OTHER PUBLICATIONS strain sensors", Journal of Materials Chemistry C, Issue 30, 2019. pp. 9423-9429, https://doi.org/10.1039/C9TC02321F.

Shi et al., "Copper release from nano-copper/polypropylene composite films to food and the forms of copper in food simulants", Innovative Food Science & Emerging Technologies, vol. 67, Jan. 2021, 102581, https://doi.org/10.1016/j.ifset.2020.102581.

Singh et al., "Temperature-regulating materials for advanced food packaging applications: a review", Journal of Food Measure, vol. 12, 2018, published online Oct. 24, 2017, pp. 588-601, DOI 10.1007/s11694-017-9672-5.

Sumnu, "A review on microwave baking of foods", Food Science +Technology, vol. 36, Issue 2, Feb. 2001, pp. 117-127.

Taylor et al., "Heat Capacity and Specific Heat", Methods of Soil Analysis: Part 1, Physical and Mineralogical Methods, 2018, pp. 941-944, doi: 10.2136/sssabookser5.1.2ed.c38.

Triantafillopoulos et al., "The future of single-use paper coffee cups: Current progress and outlook", BioResources, vol. 15, No. 3, 2020, pp. 7260-7287.

Tyagi et al., "Advances in barrier coatings and film technologies for achieving sustainable packaging of food products—A review", Trends in Food Science & Technology, vol. 115, Sep. 2021, pp. 461-485, https://doi.org/10.1016/j.tifs.2021.06.036.

Vasile, "Polymeric Nanocomposites and Nanocoatings for Food Packaging: A Review", Materials, vol. 11, 2018, doi: 10.3390/ma11101834.

Videira-Quintela et al., "Recent advances in polymer-metallic composites for food packaging applications", Trends in Food Science and Technology, vol. 8, Mar. 1, 2021, pp. 230-244, DOI: 10.1016/J.TIFS.2021.01.020.

Wei et al., "Smart Materials for Dynamic Thermal Radiation Regulation", Nano Micro Small, vol. 17, Issue 35, Sep. 2, 2021, first published May 20, 2021, 2100446, https://doi.org/10.1002/smll.202100446.

Yang et al., "Beyond the Visible: Bioinspired Infrared Adaptive Materials", Advanced Materials, vol. 33, Issue 14, Apr. 8, 2021, first published Feb. 24, 2021, 2004754, 39 pgs., DOI: 10.1002/adma.202004754.

Youssef et al., "Bionanocomposites materials for food packaging applications: Concepts and future outlook", Carbohydrate Polymers, vol. 193, Aug. 1, 2018, pp. 19-27, https://doi.org/10.1016/j.carbpol.2018.03.088.

\* cited by examiner

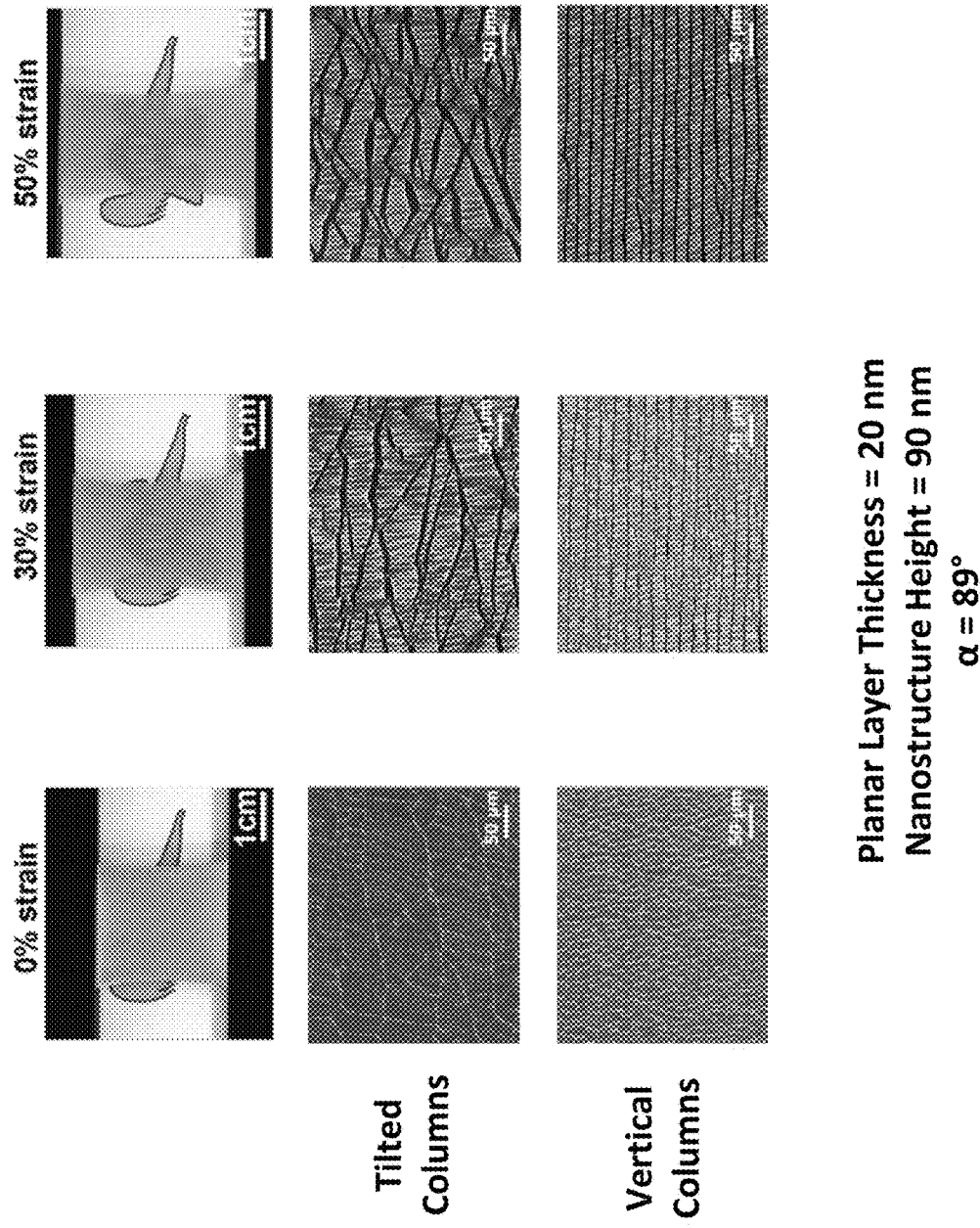
FIG. 5B1

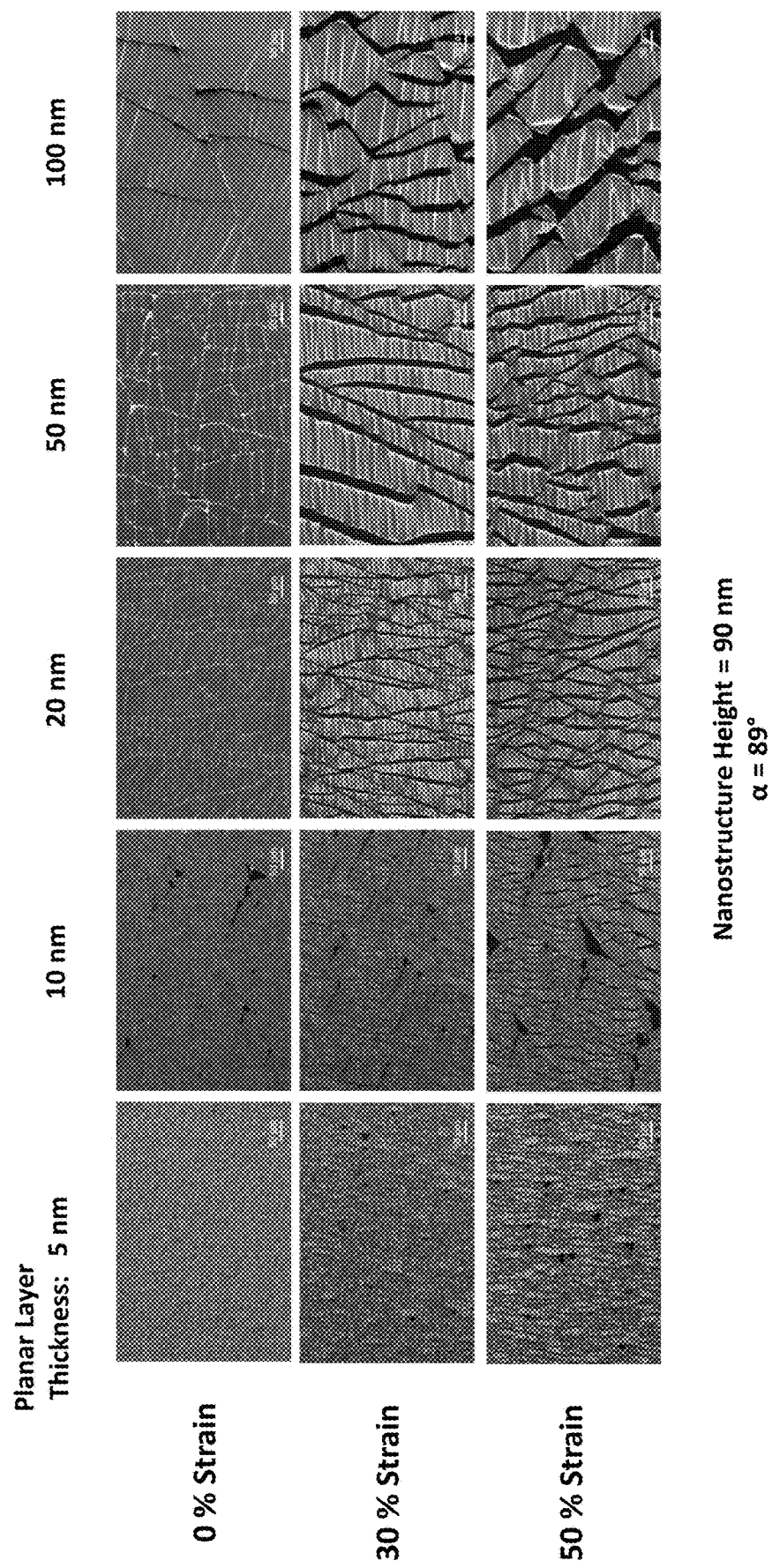
FIG. 5B2

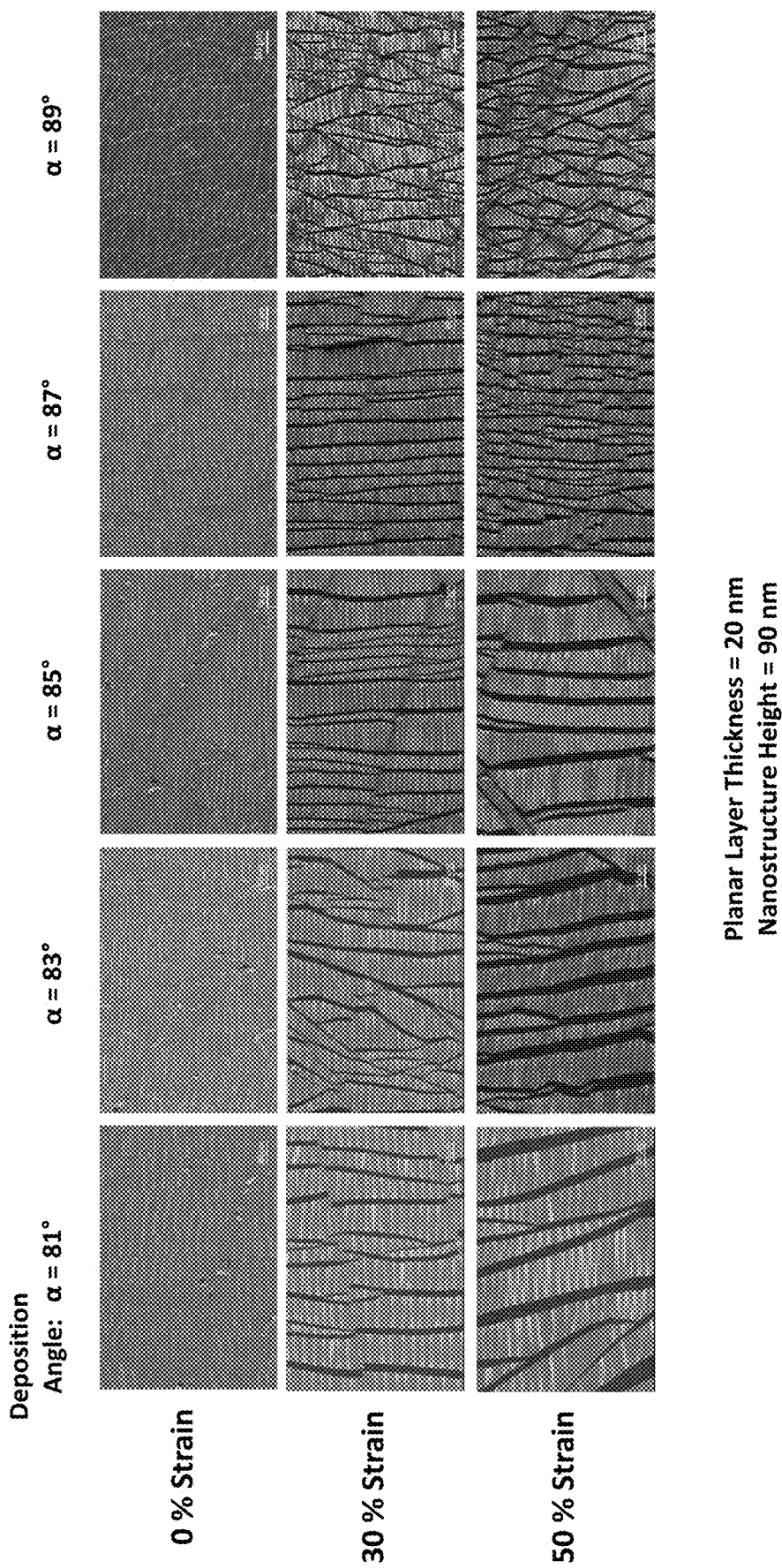
FIG. 5B3

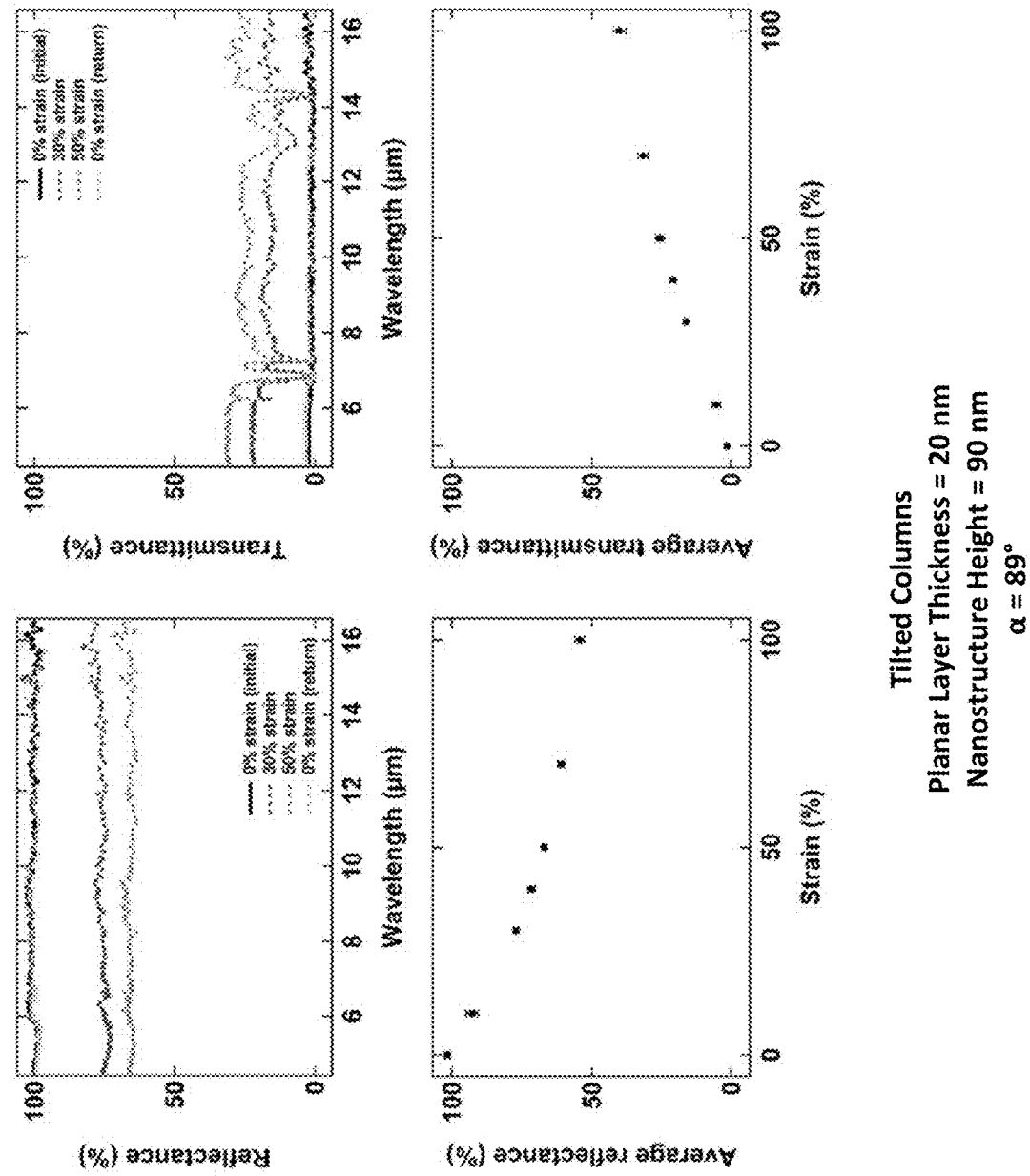
FIG. 5C1

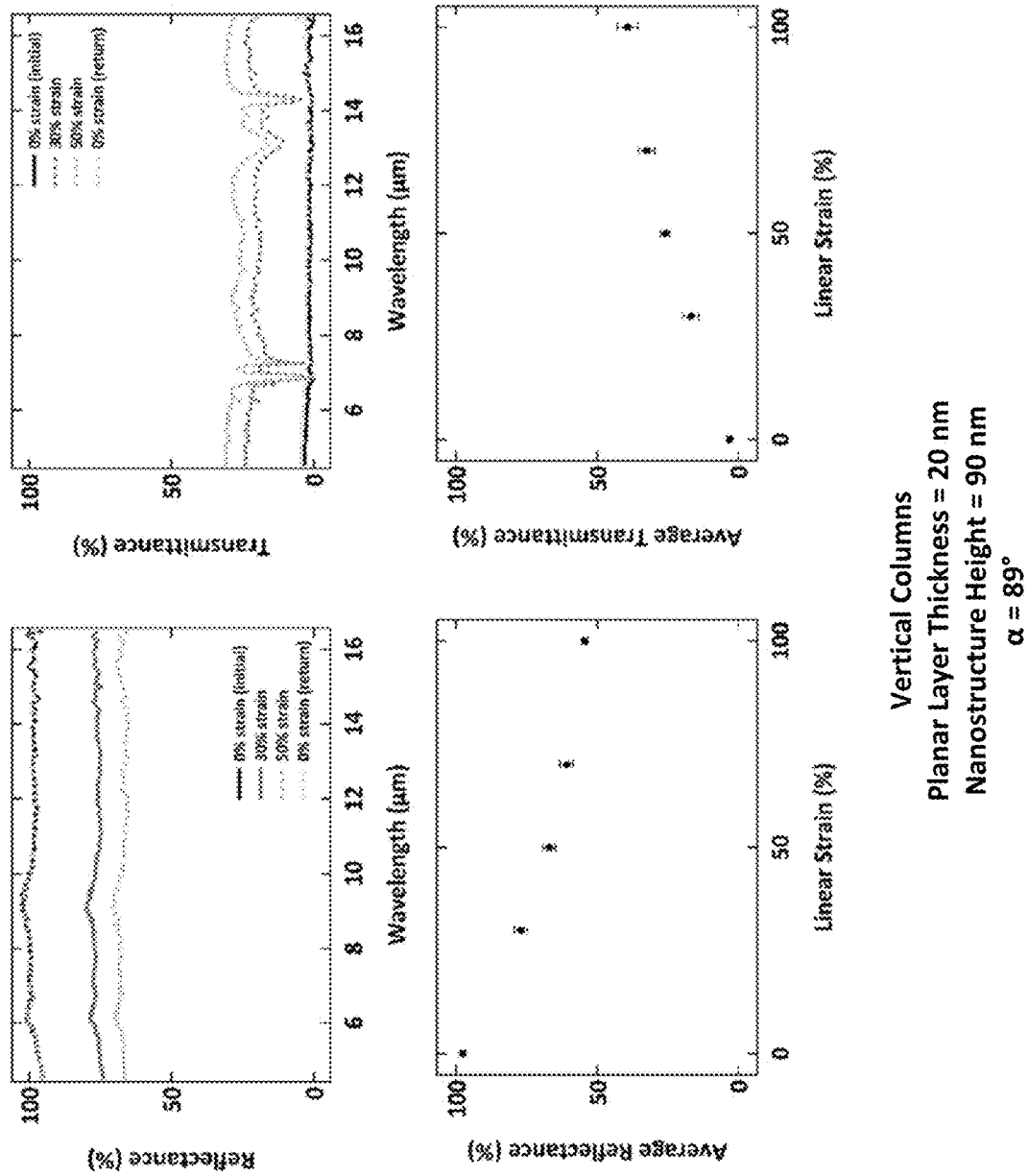
FIG. 5C2

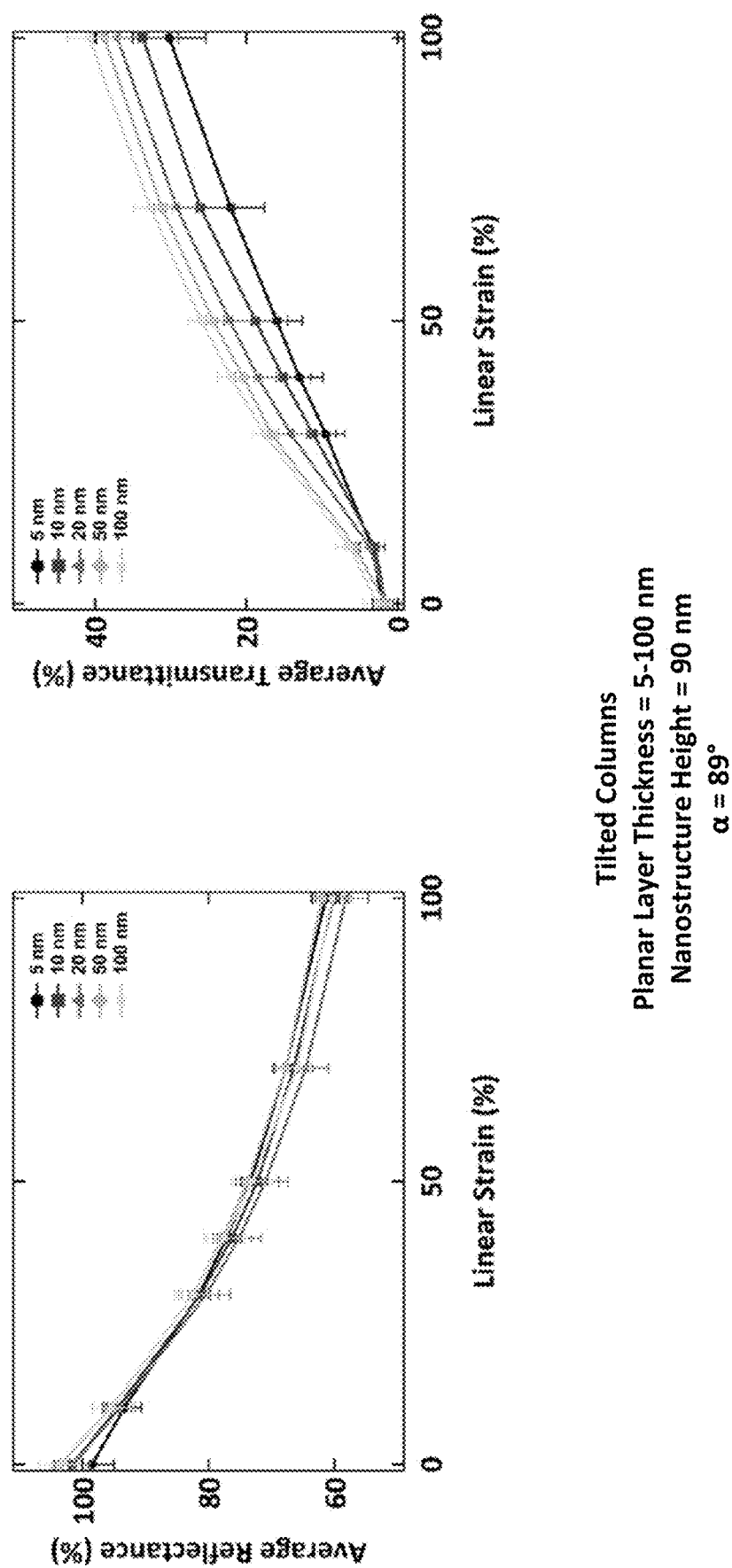
FIG. 5C3

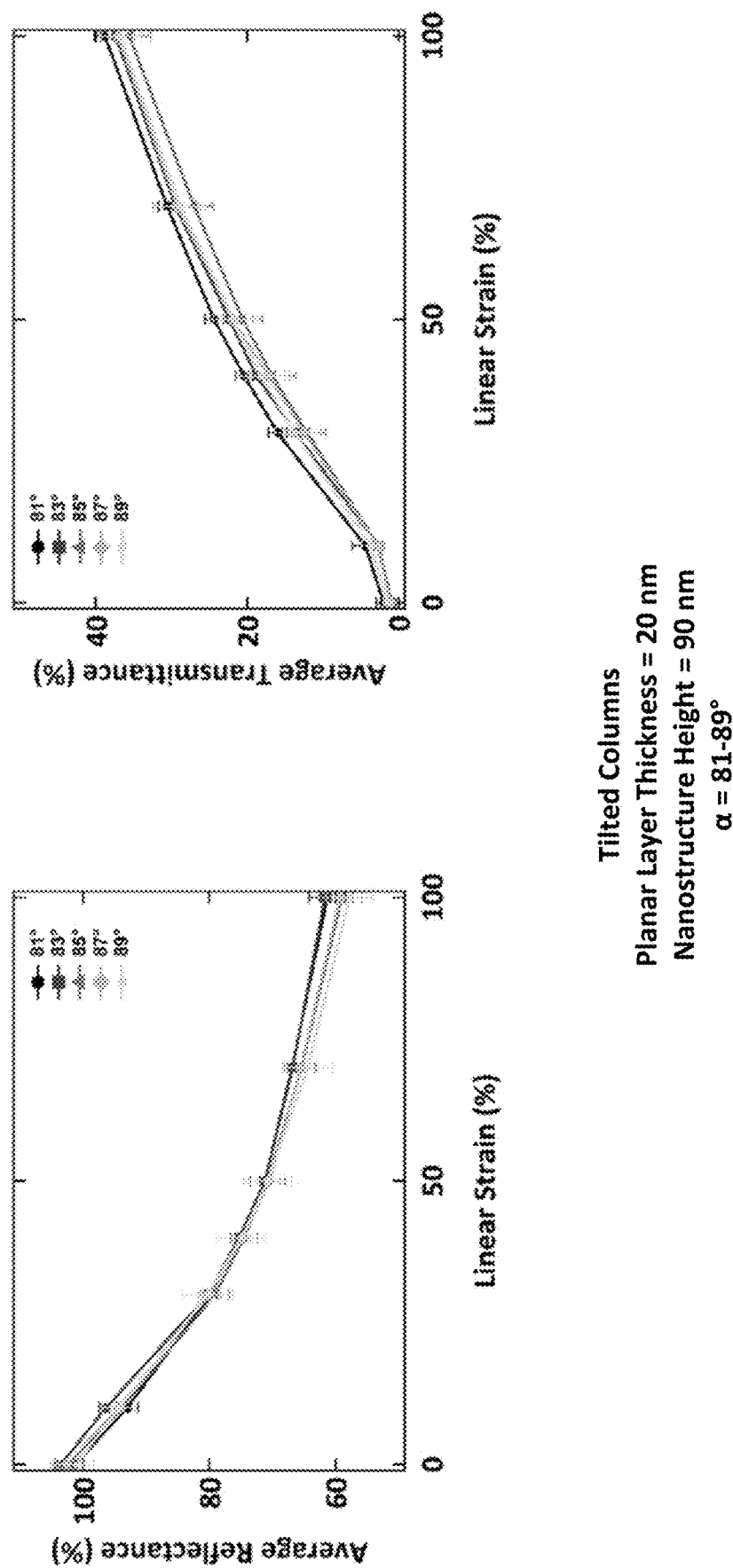
FIG. 5C4

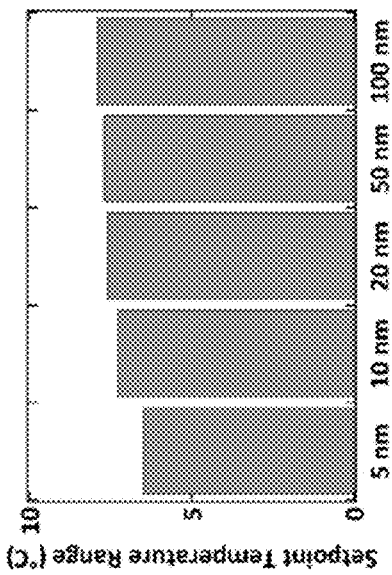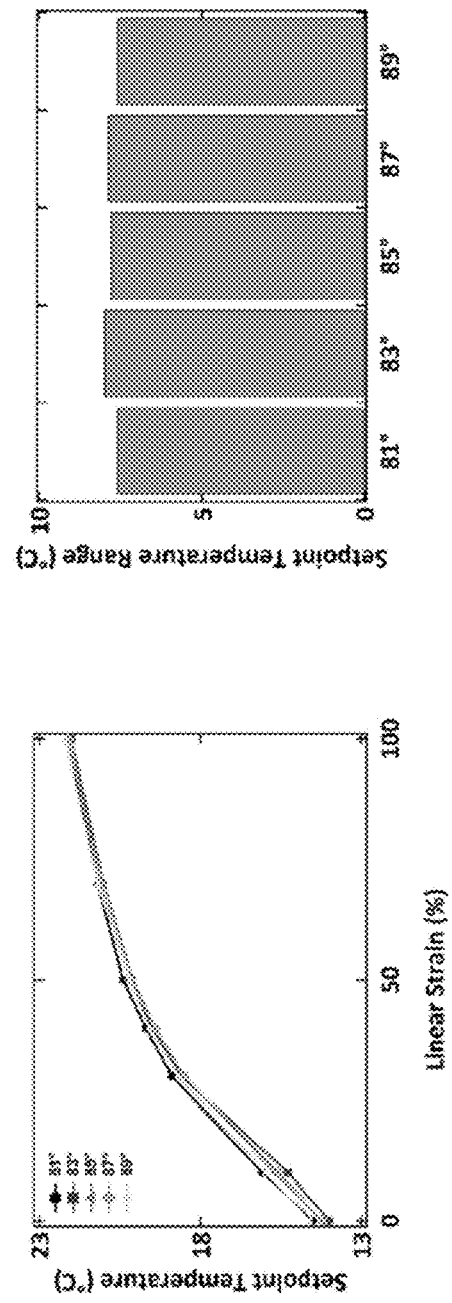
FIG. 6C
FIG. 6D

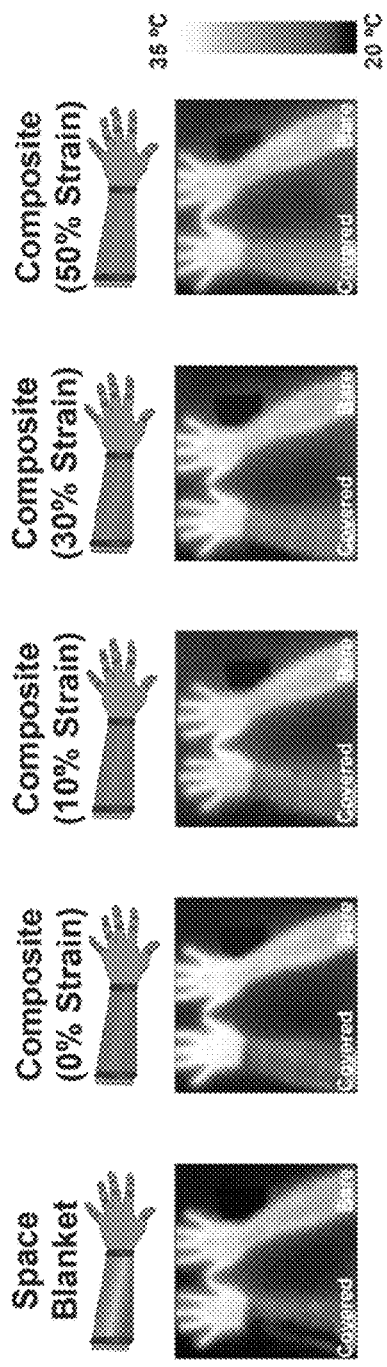
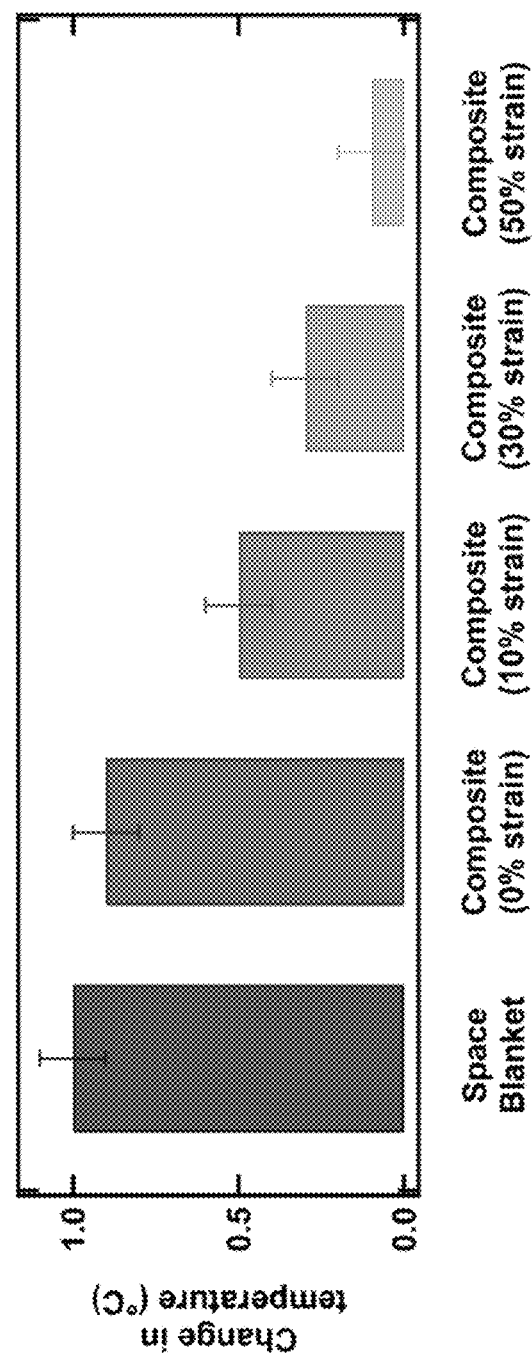
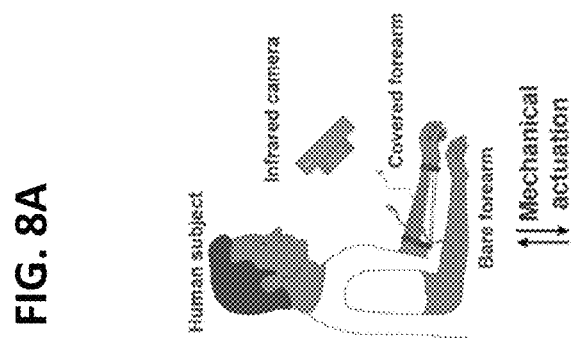
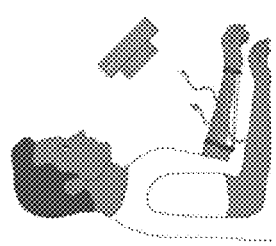
FIG. 8A
FIG. 8B
FIG. 8C

COMPOSITE MATERIALS WITH ADJUSTABLE SPECTRAL PROPERTIES

CROSS-REFERENCE TO RELATED APPLICATIONS

The present application is a national stage application under 35 USC 371 of PCT Application No. PCT/US2019/063772, entitled "Composite Materials with Adjustable Spectral Properties" to Gorodetsky et al., filed Nov. 27, 2019, which claims the benefit of and priority under 35 U.S.C. § 119(e) to U.S. Provisional Patent Application No. 62/771,974, entitled "Composite Materials with Adjustable Spectral Properties" to Gorodetsky et al., filed Nov. 27, 2018, the disclosures of which are incorporated herein by reference in their entireties.

STATEMENT REGARDING FEDERALLY SPONSORED RESEARCH

This invention was made with Government support under Grant No. DE-AR0000534 awarded by the US Department of Energy Advanced Research Projects Agency-Energy, Grant No. FA2386-14-1-3026 awarded by the Air Force Office of Scientific Research, and Cooperative Agreement No. D19AC00003 awarded by the Defense Advanced Research Projects Agency. The Government has certain rights in this invention.

FIELD OF THE INVENTION

The invention is generally directed to composite materials with adjustable spectral properties and methods of fabrication and use thereof, including use for thermal regulation.

BACKGROUND OF THE INVENTION

Effective management of heat transfer enables operation of many ubiquitous modern technologies, including electronic circuits (see, e.g., Moore, A. L., et al. Emerging challenges and materials for thermal management of electronics. Mater. Today 17, 163-174 (2014), the disclosure of which is incorporated herein by reference), aircraft and spacecraft components (see, e.g., Ahlers, M. F. Aircraft Thermal Management, John Wiley & Sons, 2011, the disclosure of which is incorporated herein by reference), medical devices (see, e.g., John, M., et al. Peri-operative warming devices: performance and clinical application. Anaesthesia 69, 623-638 (2014), the disclosure of which is incorporated herein by reference), power generation equipment (see, e.g., Kikuchi, Y., et al. Distributed cogeneration of power and heat within an energy management strategy for mitigating fossil fuel consumption. J. Ind. Ecol. 20, 289-303 (2016), the disclosure of which is incorporated herein by reference), shipping and storage containers (see, e.g., Singh, S. P., et al. Performance comparison of thermal insulated packaging boxes, bags and refrigerants for single-parcel shipments. Packag. Technol. Sci. 21, 25-35 (2008), the disclosure of which is incorporated herein by reference), specialty textiles (see, e.g., Stoppa, M., et al. Wearable electronics and smart textiles: a critical review. Sensors. 14, 11957-11992 (2014), the disclosure of which is incorporated herein by reference), and building environmental systems (see, e.g., Ürge-Vorsatz, D., et al. Heating and cooling energy trends and drivers in buildings. Renew. Sustain. Energy Rev. 41, 85-98 (2015), the disclosure of which is incorporated herein by reference). Indeed, given that heating and cooling of buildings alone directly accounts for ~14% of current energy consumption worldwide (see International Energy Agency, "Energy Technology Perspectives 2017" (2017), the disclosure of which is incorporated herein by reference), the development of novel thermoregulatory materials represents an important challenge and opportunity.

The great variety of modern approaches to thermal management (both indoors and in other settings) mainly fall in one of two categories, based on the underlying mode of operation: "passive" or "active". More specifically, passive thermal management systems leverage the intrinsic properties of the constituent materials to control heat transfer via conduction, convection, and/or radiation (see U.S. Department of Energy Advanced Research Projects Agency, "DELTA Program Overview" (2014) and Kakaç, S., et al. Microscale Heat Transfer—Fundamentals and Applications (Springer, 2005), the disclosures of which are incorporated herein by reference). Accordingly, such systems are typically inexpensive, energy efficient, and simple to implement but are also static and unresponsive to changing conditions. Examples of passive heating technologies include various types of insulation, such as batting, loose fill insulation, aerogels, woven fabrics, and reflective films and coatings, which regulate temperature by blocking the flow of heat due to the materials' low thermal conductivities and/or high infrared (IR) reflectances. On the other hand, active thermal management systems control heat transfer by converting one form of energy into another (see, e.g., Tong, X. C. Advanced Materials for Thermal Management of Electronic Packaging (Springer, New York, 2011); Gupta, N., et al. Review of passive heating/cooling systems of buildings. Energy Sci. Eng. 4,305-333 (2016); and Wang, Y., et al. A state of art review on methodologies for heat transfer and energy flow characteristics of the active building envelopes. Renew. Sustain. Energy Rev. 78, 1102-1116 (2017), the disclosures of which are incorporated herein by reference). As such, these systems are dynamic and precisely controllable by users, but are relatively expensive, energy inefficient, and complex to install. Examples of active heating technologies include electrocaloric devices, thermoelectric modules, electrothermal fabrics, heat pumps, and integrated heating/ventilation/air conditioning platforms, which regulate temperature by driving the flow of heat through the external input of electrical and/or mechanical energy.

SUMMARY OF THE INVENTION

Various embodiments are directed to composite materials with adjustable spectral properties including:
- an elastomeric matrix characterized by an elastomer thickness and comprising an IR-transparent, flexible, and stretchable material characterized by an elastic modulus;
- a plurality of micro-domains overlaying the elastomeric matrix, the plurality of micro-domains being characterized by a micro-domain thickness and comprising an IR-reflecting material;
- a plurality of spacings, separating the plurality of micro-domains, the plurality of spacings comprising the elastomeric matrix having no overlaid IR-reflecting material;
- a plurality of nanostructures anchoring the plurality of micro-domains into the elastomeric matrix, the plurality of nanostructures being characterized by a nanostructure height that is not included in the micro-domain thickness; and wherein the plurality of spacings is dynamically adjustable via mechanical manipulations of the elastomeric matrix.

In various such embodiments, the elastomer thickness is less than 300 microns.

In still various such embodiments, the elastic modulus is <$10^2$ MPa.

In yet various such embodiments, the IR-transparent, flexible, and stretchable material is selected from the group consisting of: polyethylene, polyurethane, polypropylene, polycarbonate, any block co-polymer with polystyrene, such as styrene-isoprene-styrene or styrene-butylene-styrene, or any combination thereof. In some such embodiments, the IR-transparent, flexible, and stretchable material comprises a styrene-ethylene-butylene-styrene block co-polymer.

In still yet various such embodiments, the IR-reflecting material is selected from the group consisting of: a metal, a metal or non-metal oxide, a ceramic, alloys thereof, or any combination thereof. In some such embodiments, the IR-reflecting material is selected from the group consisting of: Cu, Al, $TiO_2$, $SiO_2$, or any combination thereof.

In various such embodiments, the micro-domain thickness is 2 to 100 nm. In many such embodiments, the micro-domain thickness is 20 nm.

In still yet many such embodiments, the nanostructure height is less than 1 micron. In some such embodiments the nanostructure height is approximately 90 nm.

Various embodiments are directed to a composite material with adjustable spectral properties including:
  an elastomeric matrix characterized by an elastomer thickness and comprising an IR-transparent, flexible, and stretchable material characterized by an elastic modulus;
  a plurality of micro-domains overlaying the elastomeric matrix, the plurality of micro-domains being characterized by a micro-domain thickness and comprising an IR-reflecting material; and
  a plurality of spacings, separating the plurality of micro-domains, the plurality of spacings comprising the elastomeric matrix having no overlaid IR-reflecting material;
wherein the plurality of spacings, is dynamically adjustable via mechanical manipulation of the elastomeric matrix.

In many such embodiments, the plurality of micro-domains is anchored into the elastomeric matrix via a plurality of nanostructures characterized by a nanostructure height that is not included in the micro-domain thickness.

In still many such embodiments, the IR-transparent, flexible, and stretchable material is functionalized with chemical groups that bind the IR-reflecting material.

Various other embodiments are directed to a method of fabricating a composite material with adjustable spectral properties including:
  providing a support substrate;
  depositing an IR-reflecting material on the support substrate in two steps creating a first sub-layer and a second sub-layer; wherein
    the first sub-layer is immediately adjacent to the support substrate and comprises a continuous featureless planar layer capable of reflecting IR radiation and is characterized by a planar layer thickness, and
    the second sub-layer is immediately adjacent to the first sub-layer and comprises a plurality of nanostructures characterized by a nanostructure height;
  depositing a layer characterized by an elastomer thickness of an IR-transparent elastomeric material characterized by an elastic modulus on top of the IR-reflecting material, such that the plurality of the nanostructures becomes buried in the IR-transparent elastomeric material, thus anchoring the first sub-layer into the IR-transparent elastomeric material, to form a composite comprising the IR-reflecting material securely embedded into an IR-transparent elastomeric matrix;
  delaminating the composite from the support substrate with application of force, such that the first sub-layer breaks into a plurality of micro-domains comprising IR reflecting material surrounded by a plurality of spacings comprising the uncoated IR-transparent elastomeric matrix, to produce a free standing film of the composite material with adjustable spectral properties.

In many such embodiments, the IR-transparent elastomeric material is cured, or otherwise heat or time-treated prior to delamination.

In still various such embodiments, the IR-reflecting material is deposited onto the substrate support via physical or chemical vapor deposition technique. In many such embodiments, the IR-reflecting material is deposited onto the substrate support via electron-beam evaporation.

In yet still various such embodiments, the support substrate is selected from the group consisting of: silicon wafer, aluminum foil, polymer, or glass.

In still yet many such embodiments, the planar layer thickness is 2-100 nm. In some such embodiments, the planar layer thickness is 20 nm.

In various embodiments, the plurality of nanostructures comprises an array of nanostructures of a shape selected from the group consisting of: vertical or tilted columns, zig-zags, helices, blades, stacks of alternating thickness, or any combination thereof.

In yet many embodiments, the nanostructure height is less than 1 micron. In some such embodiments, the nanostructure height is approximately 90 nm.

In still many such embodiments, the IR-reflecting material is selected from the group consisting of: a metal, a metal or non-metal oxide, a ceramic, alloys thereof, or any combination thereof. In some such embodiments, the IR-reflecting material is selected from the group consisting of: Cu, Al, $TiO_2$, $SiO_2$, or any combination thereof.

In various such embodiments, the IR-transparent elastomeric matrix is deposited via a method selected from the group consisting of: spin coating, spray coating, slot-casting, offset printing, blade coating, melt blowing, printing, extrusion, gravure coating, laminating, or any combination thereof.

In still various such embodiments, the support substrate is aluminum foil and IR-transparent elastomeric matrix is deposited via spray coating.

In yet still various such embodiments, the elastomer thickness is less than 300 microns.

In various such embodiments, the elastic modulus is <$10^2$ MPa.

In still many such embodiments, the IR-transparent elastomeric matrix comprises a material selected from the group consisting of: polyethylene, polyurethane, polypropylene, polycarbonate, any block co-polymer with polystyrene, such as styrene-isoprene-styrene or styrene-butylene-styrene, or any combination thereof. In some such embodiments, the IR-transparent elastomeric matrix comprises a styrene-ethylene-butylene-styrene block co-polymer.

Various other embodiments are directed to a method of fabricating a composite material with adjustable spectral properties including:
  providing a support substrate;
  depositing a first sub-layer of an IR-reflecting material characterized by a planar layer thickness on top of the support substrate such that the first sub-layer of the IR-reflecting material is immediately adjacent to the support substrate and comprises the IR-reflecting material deposited into a continuous featureless layer capable of reflecting IR radiation;

depositing a layer characterized by an elastomer thickness of an IR-transparent elastomeric material characterized by an elastic modulus on top of the deposited IR-reflecting material to form a composite comprising the IR-reflecting material and an IR-transparent elastomeric matrix;

adhering the IR-reflecting material and the IR-transparent elastomeric matrix;

delaminating the composite from the support substrate with application of force, such that the first sub-layer breaks into a plurality of micro-domains comprising IR-reflecting material surrounded by a plurality of spacings comprising the uncoated IR-transparent elastomeric matrix, to produce a free standing film of the composite material with adjustable spectral properties.

In various such embodiments, the method further includes:

depositing a second sub-layer of the IR-reflecting material on top of and immediately adjacent to the first sub-layer and prior to depositing the layer of the IR-transparent elastomeric material, such that the second sub-layer comprises a plurality of nanostructures characterized by a nanostructure height, and such that depositing the layer of the IR-transparent elastomeric material buries the plurality of nanostructures into the IR-transparent elastomeric matrix, thus anchoring the first sub-layer into the IR-transparent elastomeric matrix to form the composite comprising the IR-reflecting material securely embedded into an IR-transparent elastomeric matrix.

Yet various other embodiments are directed to a method for controlling IR radiation emitted by an object or body including:

enveloping the object or body emitting IR radiation in a composite material with adjustable spectral properties comprising:

an elastomeric matrix characterized by an elastomer thickness and comprising an IR-transparent, flexible, and stretchable material characterized by an elastic modulus, a plurality of micro-domains overlaying the elastomeric matrix, the plurality of micro-domains being characterized by a micro-domain thickness and comprising an IR-reflecting material, a plurality of spacings separating the plurality of micro-domains, the plurality of spacings comprising the elastomeric matrix having no overlaid IR-reflecting material, and a plurality of nanostructures anchoring the plurality of micro-domains into the elastomeric matrix, the plurality of nanostructures being characterized by a nanostructure height that is not included in the micro-domain thickness, wherein the plurality of spacings is dynamically adjustable via mechanical manipulations of the elastomeric matrix; and mechanically manipulating the elastomeric matrix in a controlled manner to adjust the plurality of spacings between the plurality of micro-domains to release or contain IR radiation emitted by the object or body.

In various such embodiments, IR radiation is heat.

In still various such embodiments, the mechanical manipulation is achieved via a method selected from the group consisting of: application of strain, shearing, pressure, flexing, twisting, bending, or any combination thereof.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

These and other features and advantages of the present invention will be better understood by reference to the following detailed description when considered in conjunction with the accompanying data and figures, wherein:

FIGS. 5A-5D illustrate mechanical and optical properties of the composite materials in accordance with embodiments of the application; wherein: FIG. 5A. illustrates the mechanical properties of the composite material with a plot of engineering stress versus engineering strain for the composite material, and the enlarged linear region of the plot (used for determination of the elastic modulus of the composite material); FIG. 5B1 shows digital camera and SEM images of the composite material at various stages of actuation (at 0%, 30%, and 50% strain); FIGS. 5B2 and 5B3 further show SEM images taken at various stages of actuation (at 0%, 30%, and 50% strain) for composite materials produced under various fabrication conditions; FIGS. 5C1 and 5C2 shows the infrared reflectance and transmittance spectra for the composite materials comprising tiled and vertical column nanostructures, correspondingly, at various stages of actuation (at 0%, 30%, and 50% strain), as well as corresponding plots of the average reflectance and average transmittance as a function of the applied strain for the same materials; FIGS. 5C3 and 5C4 compile the average reflectance and average transmittance data for the composite materials fabricated under varying deposition conditions; and FIG. 5D illustrates the stability of the composite materials towards repeated mechanical actuation.

FIGS. 6A-6D illustrate the versatility of the composite materials for wearable thermal regulation applications, in accordance with embodiments of the application, wherein: FIG. 6A compares the calculated thermoregulating performance of the composite material at various stages of mechanical actuation to that of common materials and textiles used in clothing; FIG. 6B schematically illustrates the model used to compare the thermoregulating performance of the materials from FIG. 6A, and FIGS. 6C and 6D compare the calculated setpoint temperatures of the composite materials fabricated under varying deposition conditions.

FIGS. 8A-8C demonstrate operation and thermoregulatory effect of an adjustable composite material-based sleeve applied to a human body, in accordance with embodiments of the application, wherein FIG. 8A illustrates the experimental setup and FIGS. 8B and 8C provide representative infrared camera images and experimental data.

DETAILED DISCLOSURE

Turning now to the schemes, images, and data, composite materials with adjustable spectral properties and capable of dynamically controlling IR radiation transmission are described, as well as methods of fabrication thereof, systems with capabilities to regulate IR radiation transmission based thereon, and methods of regulating IR radiation transmission using the same. It will be understood that the embodiments of the invention described herein are not intended to be exhaustive or to limit the invention to precise forms disclosed. Rather, the embodiments selected for description have been chosen to enable one skilled in the art to practice the invention.

Heat transfer management critically underpins the performance of many entrenched technologies, including building insulation (I. Hernández-Pérez et al., Thermal performance of reflective materials applied to exterior building components—A review. Energy Build. 80, 81-105 (2014), the disclosure of which is incorporated herein by reference), energy-conserving windows (U.S. Department of Energy, Energy-Efficient Windows, https://energy.gov/energysaver/energy-efficient-windows, the disclosure of which is incorporated herein by reference), spacecraft components (NASA, A Shining Example of Space Benefits (2007), https://www.nasa.gov/vision/earth/technologies/silver_insulation.html, the disclosure of which is incorporated herein by reference), electronics shielding (S. Geetha, et al., EMI shielding: Methods and materials-A review. J. Appl. Polym. Sci. 112, 2073-2086 (2009), the disclosure of which is incorporated herein by reference), container packaging (S. P. Singh, et al., Performance comparison of thermal insulated packaging boxes, bags and refrigerants for single-parcel shipments. Packag. Technol. Sci. 21, 25-35 (2008), the disclosure of which is incorporated herein by reference), and even protective clothing (J. F. Sacadura, Radiative heat transfer in fire safety science. J. Quant. Spectrosc. Radiat. Transf. 93, 5-24 (2005), the disclosure of which is incorporated herein by reference). However, all of the currently available heat management technologies require some kind of a trade-off between the cost and ease of implementation of passive systems and the dynamic control capabilities of active systems. Accordingly, an "ideal" thermal management platform that would merge the advantageous characteristics of both types of systems, i.e., minimal cost, straightforward implementation, and little-to-no energy consumption with user control capabilities, remains elusive, yet highly desirable.

Figure 1A:
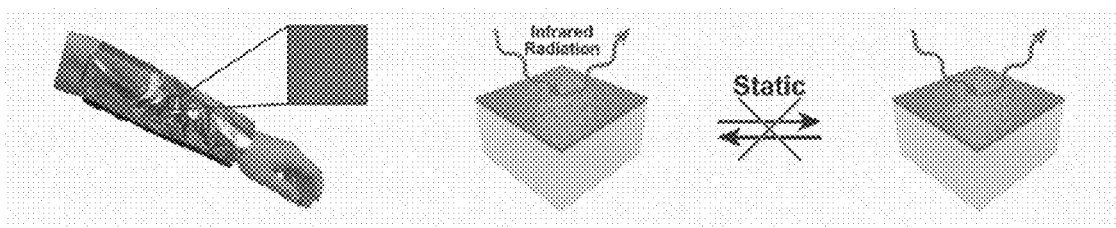
FIG. 1A provides a picture of an IR-reflecting "space blanket" material applied to a forearm (left) and a top/side-view schematic of its structure, comprising an aluminum film on top of a polyethylene terephthalate layer (right), according to prior art.

Among the passive systems, the "space blanket," developed by NASA in the 1960's to mitigate the effects of temperature fluctuations in outer space, represents one of the most recognized and impactful thermal management technologies to date (FIG. 1A) (see NASA, Reflecting on space benefits: a shining example. Spinoff 2006, 56-61 (2006), the disclosure of which is incorporated herein by reference). In its standard incarnation, the space blanket consists of a transparent plastic sheet overlaid with a thin coating of metal (FIG. 1A, inset and right side)—an architecture highly effective at reflecting infrared (IR) radiation, including heat. Moreover, due to a favorable combination of properties, such as low weight, compactness, and manufacturability, various adaptations of the space blanket have found applications in food packaging, emergency portable shelters, medical warming devices, protective clothing, building insulation, and solar concentrators. As such, this thermoregulatory platform has facilitated space exploration, saved lives within a variety of settings, helped improve food storage, and reduced global energy consumption (see Meyer, R. X. Elements of Space Technology (Elsevier, 1999); Skrabec, Q. R. Aluminum in America: A History (Mcfarland & Company, Inc., 2017); and Watkins, S. M., et al. Functional Clothing Design: From Sportswear to Spacesuits (Fairchild Books, New York, 2015), the disclosures of which are incorporated herein by reference). However, the space blanket is a static "on/off"-type technology that cannot be reconfigured on demand or dynamically adjusted in any way (FIG. 1A, right). Surprisingly, despite its ubiquity, the space blanket has remained fundamentally unchanged as a passive thermal management technology and still functions in much the same way it did over fifty years ago.

Among the active systems for thermal management applications, recent efforts have focused on the development of devices with adaptive switching capabilities. These devices consist of stimuli-responsive materials, i.e. metal oxide layers, low pressure gases, or conducting polymer films, which are placed within a gap or junction and mediate the transport of heat via conduction, convection, or radiation (see Li, N. et al. Phononics: manipulating heat flow with electronic analogs and beyond. Rev. Mod. Phys. 84, 1045-1066 (2012); Wehmeyer, G., et al. Thermal diodes, regulators, and switches: physical mechanisms and potential applications. Appl. Phys. Rev. 4, 041304 (2017); and DiPirro, M. J., et al. Heat switches for ADRs. Cryogenics 62, 172-176 (2014); the disclosure of which is incorporated herein by reference). In such configurations, the transfer of heat is dynamically modulated (switched) with an external nonthermal input, i.e. a mechanical pressure, an applied voltage, or a magnetic field. The thermal switches have shown promise in applications related to refrigeration, waste heat scavenging, thermal control for electronic circuits, energy storage/conversion, and temperature regulation in an aircraft. However, to gain wide-spread application, the switches must satisfy numerous demanding criteria, including manufacturability over large areas, a straightforward actuation method, reversibility and tunability without hysteresis, stability to repeated cycling, a soft and flexible form factor, rapid response time, high on/off ratios, and a low operating temperature. To date, no single thermal switching technology has been shown to simultaneously possess all of these characteristics.

Figure 1B:
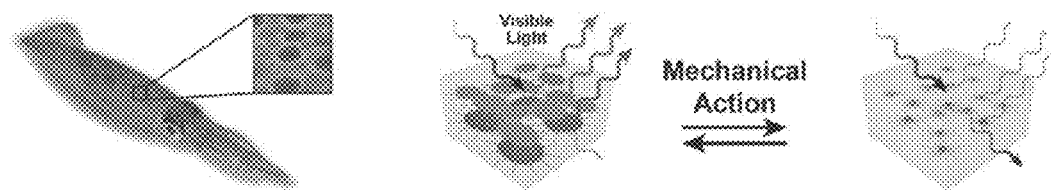
FIG. 1B provides an illustration of a squid and its chromatophore-containing skin, (left) and a top/side-view schematic further explaining how muscle contraction changes the size of the chromatophore organs and the reflection/transmission of light (right), according to prior art.

In contrast, nature has mastered developed highly effective strategies for adaptively and dynamically controlling materials properties. For example, the color-changing abilities of coleoid cephalopods can serve as a judicious source of inspiration for adaptive thermal management systems (FIG. 1B) (see Máthger, L. M., et al. Mechanisms and behavioural functions of structural coloration in cephalopods. J. R. Soc. Interface 6, S149-S163 (2009); Kreit, E. et al. Biological versus electronic adaptive coloration: how can one inform the other? J. R. Soc. Interface 10, 1-13 (2012); and Phan, L. et al. Dynamic materials inspired by cephalopods. Chem. Mater. 28, 6804-6816 (2016); the disclosure of which is incorporated herein by reference). In particular, the skin of squid contains a transparent dermal layer that features embedded chromatophore organs arranged in a dense, arrayed pattern, with each individual organ comprised of a red, yellow, or brown central pigment cell surrounded by anchored innervated muscle cells (FIG. 1B, inset) (see Messenger, J. B. Cephalopod chromatophores: neurobiology and natural history. Biol. Rev. Camb. Philos. Soc. 76, 473-528 (2001); Kirkwood, K. M., et al. Mechanics of the cephalopod chromatophore layer: structural characterization of cephalopod chromatophores. In ASME 2011 Summer Bioengineering Conference 2011, 427-428 (2011); Suzuki, M., et al. Chromatophore activity during natural pattern expression by the squid Sepioteuthis lessoniana: contributions of miniature oscillation. PLoS One 6, e18244 (2011); and Bell, G. R. R. et al. Chromatophore radial muscle fibers anchor in flexible squid skin. Invertebr. Biol. 132, 120-132 (2013); the disclosure of which is incorporated herein by reference). In this highly-evolved natural architecture, the muscle cells dynamically switch the pigment cells between shrunk point-like and expanded plate-like states (either independently or in tandem), thereby simultaneously modulating the local coloration and changing the transmission of light through the skin (FIG. 1B, right). This unique capability of the squid skin has inspired various artificial color- and appearance-changing systems, including biomimetic soft active surfaces (see Rossiter, J., et al. Biomimetic chromatophores for camouflage and soft active surfaces. Bioinspir. Biomim. 7, 036009 (2012), the disclosure of which is incorporated herein by reference), optoelectronic camouflage displays (see Yu, C. et al. Adaptive optoelectronic camouflage systems with designs inspired by cephalopod skins. Proc. Natl. Acad. Sci. U.S.A. 111, 12998-13003 (2014), the disclosure of which is incorporated herein by reference), electromechanochemically responsive elastomers (see Wang, Q., et al. Cephalopod-inspired design of electro-mechano-chemically responsive elastomers for on-demand fluorescent patterning. Nat. Commun. 5, 4899 (2014), the disclosure of which is incorporated herein by reference), stretchable electroluminescent materials (see Larson, C. et al. Highly stretchable electroluminescent skin for optical signaling and tactile sensing. Science 351, 1071-1074 (2016), the disclosure of which is incorporated herein by reference), and adaptive infrared-reflecting systems (see Xu, C., et al. Adaptive infrared-reflecting systems inspired by cephalopods. Science 359, 1495-1500 (2018), the disclosure of which is incorporated herein by reference). Moreover, natural squid skin and its constituent components exhibit nearly all of the capabilities required for wearable thermal switch applications discussed above, making them promising models for novel thermoregulatory platforms.

Figure 1C:
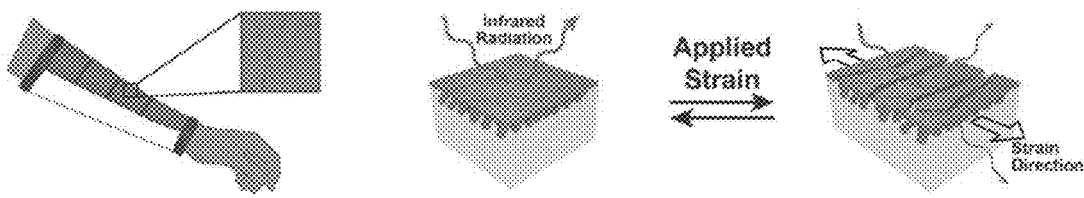
FIG. 1C provides a schematic of the composite material with adjustable spectral properties applied to a forearm (left) and a top/side-view schematic of its structure, comprising IR-reflecting micro-domains embedded in an IR-transparent elastomeric matrix (right), in accordance with embodiments of the application.

This application is directed to embodiments of fully artificial, composite materials with adjustable spectral properties for management of IR radiation, including heat, and methods of manufacture and use thereof. In many embodiments, the composite material of the application (FIG. 1C) draws inspiration from both the simple, static, IR radiation-reflecting space blanket technology (FIG. 1A) and the sophisticated, dynamic, color-changing squid skin (FIG. 1B). Accordingly, in many embodiments, the composite material possesses the performance metrics of both the space blanket, including straightforward manufacturability and minimal energy input requirement, and squid skin, including on-demand user control of properties. In many embodiments, the composite material with adjustable spectral properties is used as a component in thermal management systems to regulate transmission of heat. In some such embodiments, the thermal management systems incorporating the composite material are wearable systems. In many embodiments, the thermal management systems incorporating the composite material are articles of clothing or clothing components, such as sleeves or panels.

In many embodiments, the composite material with adjustable spectral properties comprises a stretchable IR-transparent matrix overlaid with micro-domains of an IR-reflecting material. In many such embodiments, the IR-reflecting micro-domains can be moved apart from one another such that they are separated by spacings, i.e. uncovered areas, comprising bare matrix regions. More specifically, in many embodiments, mechanical manipulation of the stretchable matrix, such as stretching and releasing, allows for the dynamic adjustment of the width/size of the areas surrounding the IR-reflecting micro-domains (FIG. 1C, right), thus allowing for the transmission of IR radiation by the composite material when the micro-domains are far apart from one another (i.e. "open") or trapping the IR radiation with the composite material when the micro-domains are clustered together (i.e. "shut"). In many embodiments, precaution is taken to ensure excellent adhesion between the elastomeric matrix and the overlaying IR-reflecting micro-domains, in order to preserve the robustness of the composite through all manipulations of the matrix (e.g., stretching, twisting, etc.), such that only the relative arrangement and distance between the micro-domains is affected (e.g., without any damage or delamination of the micro-domains). Therefore, in many embodiments, each micro-domain is anchored into the matrix via nanostructures. In many embodiments, the anchoring nanostructures comprise designer columnar nanostructures. In some embodiments, the anchoring nanostructures comprise interface surface roughness. However, in some embodiments the judicious choice of materials allows for sufficient adhesion without help from nanostructure anchoring. For example, in some embodiments, the proper adhesion between the IR-reflecting micro-domains and the elastomeric matrix is achieved by using a specific combination of metal or inorganic material and an elastomer functionalized with chemical groups that specifically bind the said metal or inorganic material. For example, copper metal may be used with a catechol-functionalized matrix. In many embodiments, a combination of physical (i.e., nanostructures) and chemical bonding is used to ensure robust attachment of IR-reflecting micro-domains to the IR-transparent elastomeric matrix.

In many embodiments the elastomeric matrix comprises a soft and flexible IR-transparent polymer. In many embodiments, the matrix comprises any IR-transparent elastomer with low elastic modulus. In many embodiments the elastic modulus of the matrix elastomer is <$10^2$ MPa. In some such embodiments, the elastic modulus is 2 MPa. In many such embodiments, the IR-transparent matrix comprises a stretchable, IR-transparent material chosen from the list: polyethylene, polyurethane, polypropylene, polycarbonate, any block co-polymer with polystyrene, such as styrene-isoprene-styrene (SIS), styrene-butylene-styrene (SBS), or styrene-ethylene-butylene-styrene (SEBS) block co-polymer, any combination thereof. In many embodiments the thickness of the elastomer matrix is chosen so as to ensure the overall robustness of the composite material, while maintaining sufficient IR-transparency of the matrix. In many embodiments, the thickness of the elastomer matrix is less than 300 microns. In many embodiments, including wherein the matrix comprises a SEBS block co-polymer, the matrix thickness is approximately 30 microns.

In many embodiments, the IR-reflecting component of the composite material of the application comprises a material selected from the list comprising: a metal, a metal or non-metal oxide, a ceramic, or any combination thereof, including alloys of thereof. In some such embodiments, the IR-reflecting material is selected from the list comprising: Cu, Al, $TiO_2$, $SiO_2$, or any combination or alloy thereof. In many embodiments, the IR-reflecting material layer of the composite material is not continuous, but is broken into micro-domains, wherein each micro-domain is surrounded by cracks, which, in turn, become widths of the bare elastomeric matrix (to which the micro-domain is adhered to) upon stretching of the same. In some embodiments, wherein the adhesion of the IR-reflecting material to the elastomeric matrix is achieved via nanostructure anchoring, each micro-domain comprises two immediately adjacent sub-layers: a continuous IR-reflecting, outfacing sub-layer and a nanostructured anchoring sub-layer that interfaces with the elastomeric matrix. In many embodiments, the thickness of the continuous IR-reflecting sub-layer is 2-100 nm, which ensures the overall robustness and optimal performance of the composite material. In many embodiments, the thickness of the continuous IR-reflecting sub-layer is 20 nm. In many embodiments, the thickness of the anchoring sub-layer, when present, is less than 1 micron. In some embodiments, the absence of the nanostructured anchoring sub-layer greatly facilitate the manufacturing of composite materials, but potentially at the expense of composite material stability when in use.

Figure 2:
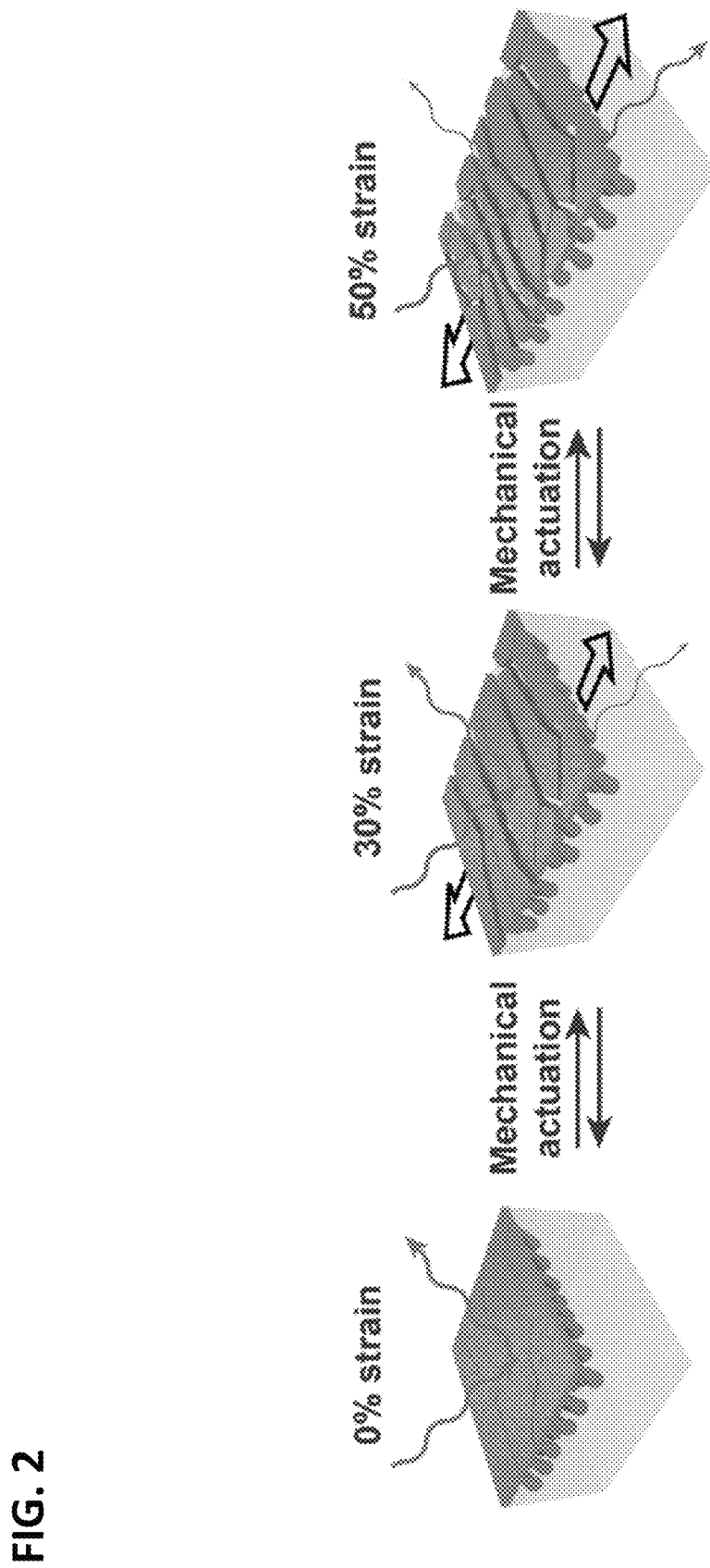
FIG. 2 provides a schematic of IR radiation-regulating mechanisms of operation for the composite material with adjustable spectral properties upon application of various levels of mechanical actuation (0%, 30%, and 50% strain), in accordance with embodiments of the application.

In many embodiments, the spectral properties of the composite material are adjusted via application and removal of mechanical actuation (FIG. 2). In many embodiments, the mechanical actuation comprises one of: application of strain, shearing, pressure, flexing, twisting, bending, or any combination thereof. In many embodiments, the composite material of the application in its relaxed state (i.e., 0% applied strain) comprises, for example, a plurality of irregularly shaped IR-reflecting micro-domains densely packed on top of the IR-transparent matrix, into which they are anchored via interfacial nanostructures (FIG. 2, left). In this configuration, the composite material of the embodiments reflects nearly all incident IR radiation. In turn, upon mechanical actuation, the matrix-anchored IR-reflecting micro-domains of many embodiments are spread apart due to stretching of the underlying elastomeric matrix (FIG. 2, center and right). In this "stretched" configuration, the IR-transparent matrix is exposed between the IR-reflecting micro-domains and the composite material of the embodiments as a whole transmits a significant fraction of the incident IR radiation. Accordingly, in many embodiments, the overall operating mechanism of the composite material with adjustable spectral properties comprises an on-demand controllable mechanical actuation or relaxation, wherein the spacings, i.e. uncovered areas, between the IR-reflecting micro-domains of the composite material are altered by stretching and relaxing the underlying soft, elastic, IR-transparent matrix. Notably, the operating mechanism according to such embodiments differs from that of natural squid skin, wherein the area of the light-reflecting components (chromatophore organs) themselves is altered upon actuation. In some embodiments, the IR radiation manipulated by the composite material is heat.

Figure 3A:
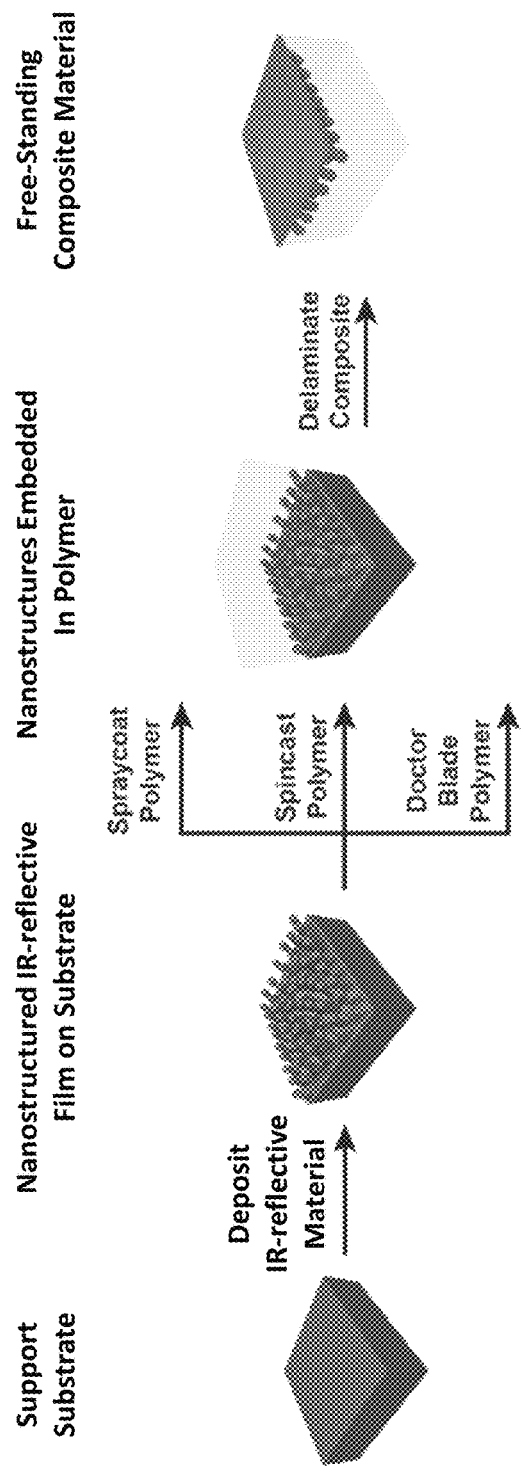
FIGS. 3A and 3B schematically illustrate the fabrication of the composite material with adjustable spectral properties, wherein FIG. 3B additionally illustrates fabrication on a large scale, in accordance with embodiments of the application.
Figure 3B:
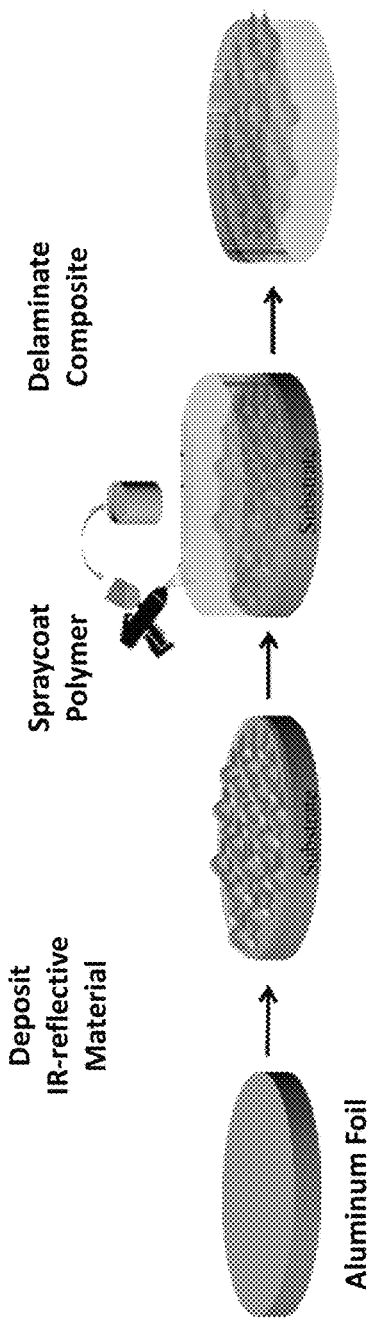

In many embodiments, the composite material with adjustable spectral properties is fabricated according to the schemes outlined in FIGS. 3A and 3B. In many such embodiments, first, an IR-reflecting material is deposited onto a support substrate via a physical or chemical deposition technique. In many embodiments, the IR-reflecting material is deposited via electron-beam evaporation. In many embodiments, the IR-reflecting material is deposited in one or two sub-layers of different architecture, as desired, in situ, wherein the first sub-layer is a smooth featureless layer of the IR-reflecting material and the second optional layer comprises the same material deposited into nanoarchitectures (FIG. 3A, second from left). In many such embodiments, a continuous smooth (or "planar") sub-layer of the IR-reflecting material is first deposited onto the support substrate oriented perpendicularly to the vapor flux. In many embodiments, the thickness of this continuous sub-layer is 2-100 nm. It has been found that the continuous sub-layer deposited with a thickness of less than 2 nm or more than 100 nm may not delaminate (peel off) from the support substrate properly and likely does not afford the continuity and stability required for the proper fabrication and subsequent operation of the composite material of the application. In addition, depositing an IR-reflective sub-layer with a thickness of more than 100 nm also negatively affects the resulting composite material, wherein the thicker continuous sub-layer results in the formation of IR-reflecting micro-domains with sub-optimal sizes during the delamination step of the fabrication process, and, consequently, in sub-optimal performance of the composite material. In many embodiments, the thickness of the continuous IR-reflecting sub-layer is 20 nm.

Figure 4A:
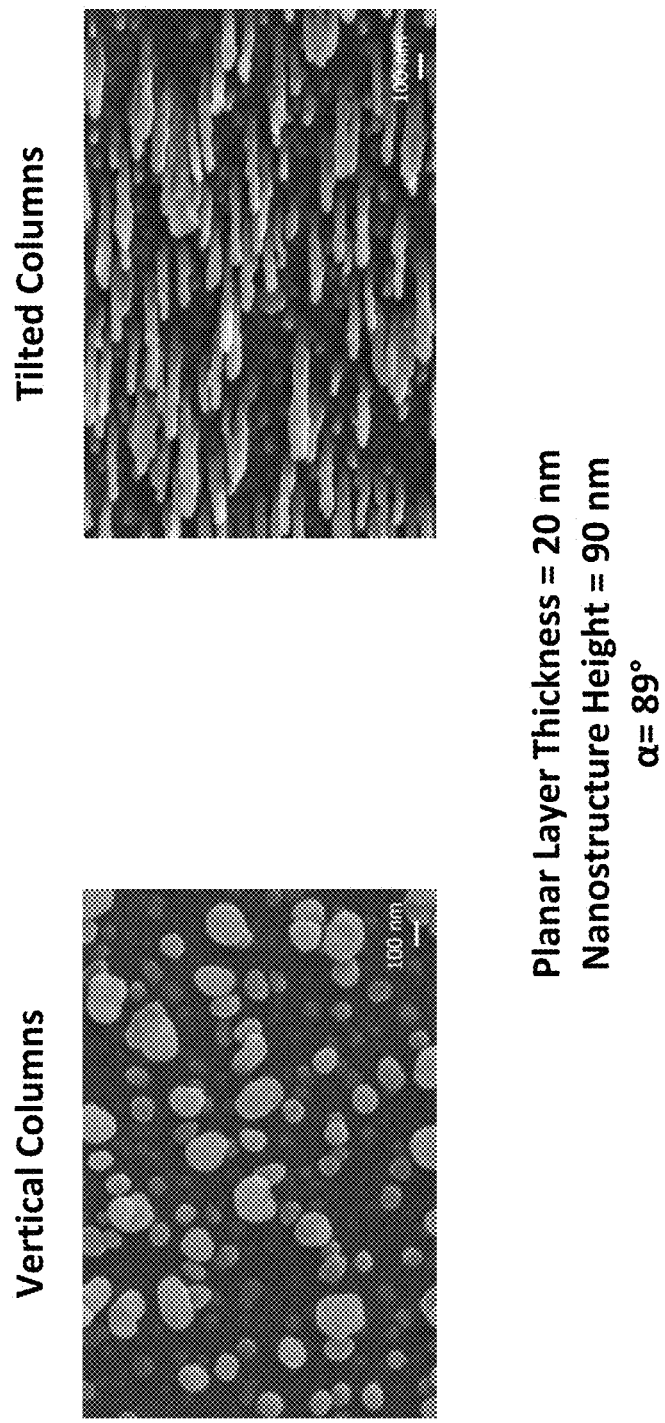
FIGS. 4A-4C provide scanning electron microscopy (SEM) images of the columnar nanostructures of the IR-reflecting material (copper) taken at various viewing points for various IR-reflecting material deposition conditions, in accordance with various embodiments of the application.
Figure 4B:
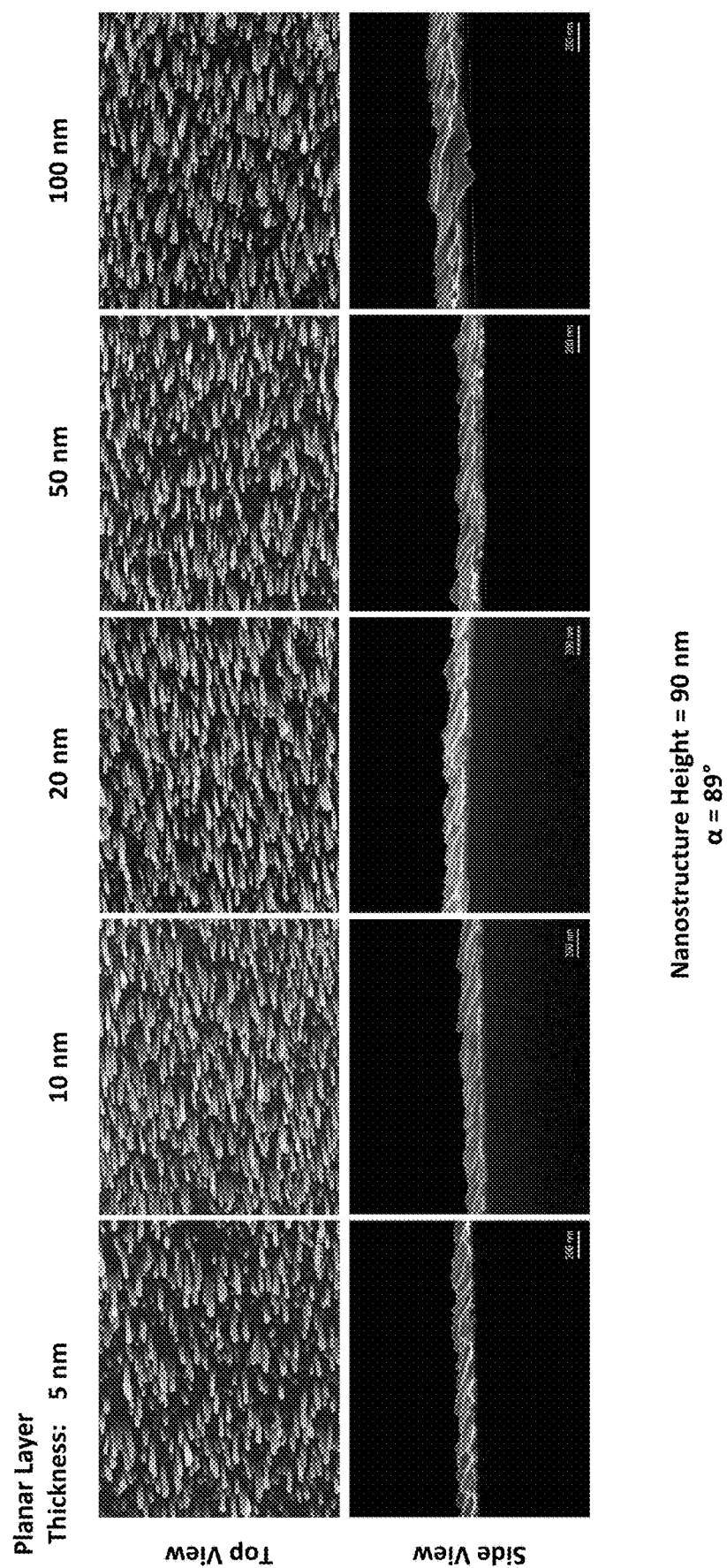
Figure 4C:
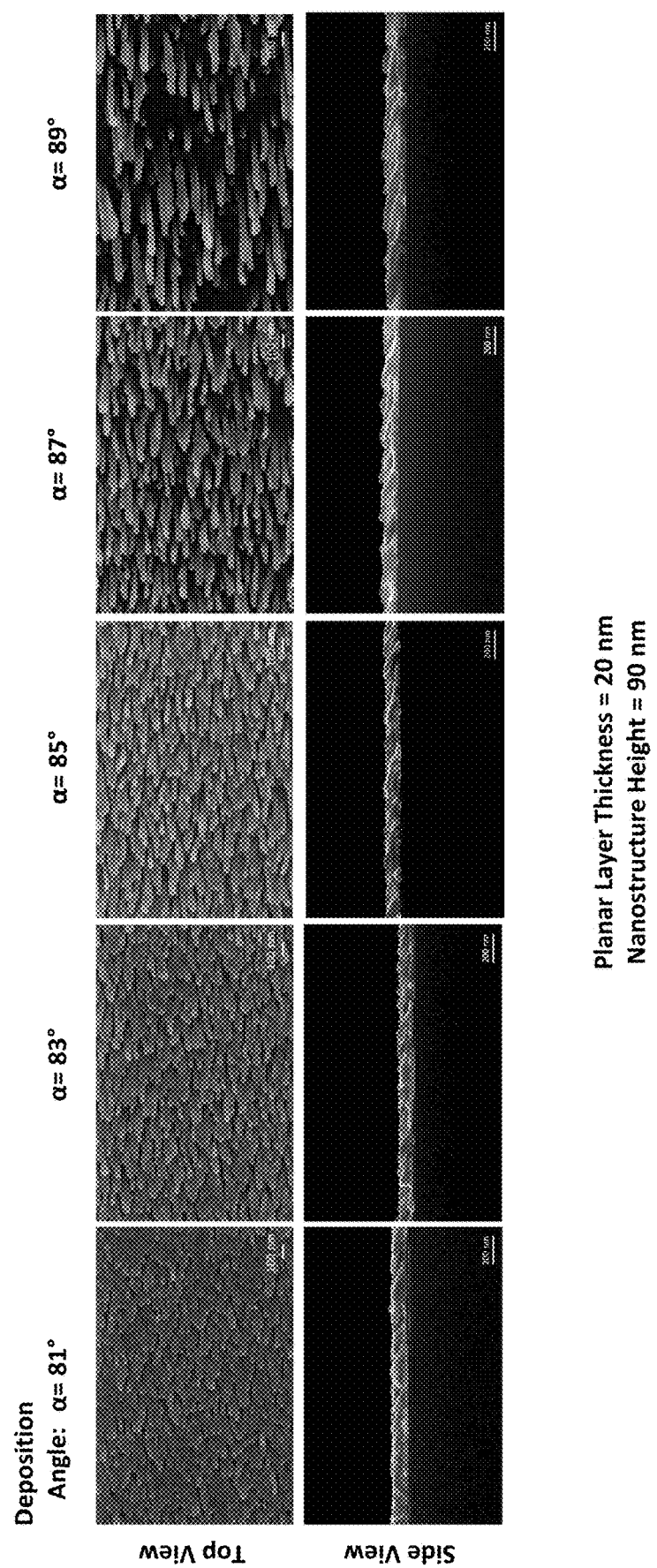

In many embodiments, next, an optional nanostructured sub-layer is deposited on top of the continuous/planar sub-layer of the IR-reflective material to allow for anchoring into the elastomeric matrix (FIG. 3A). In many embodiments, the nanostructures are an array of vertical or tilted columns of various thicknesses (FIG. 4A). For examples, in some embodiments, an array of tilted columns is deposited on top of continuous sub-layer by tilting the support substrate to form an angle of 89° with the normal to the vapor flux to create a nanostructured sub-layer comprised of arrayed tilted nanoscale columns via oblique angle deposition (see Barranco, A., et al. Perspectives on oblique angle deposition of thin films: from fundamentals to devices. Prog. Mater. Sci. 76, 59-153 (2016), the disclosure of which is incorporated herein by reference) (FIG. 4B). In some embodiments, the angle of column deposition (α) is less than 89°, such as α=81°, 83°, 85°, or 87° (FIG. 4C). In some embodiment, α is chosen to accommodate a deposition of an IR-reflecting material of choice. For example, in some embodiments, wherein the IR-reflective material of choice is copper, the preferred α is more than 75°. Notably, it has been observed that the angle of deposition might affect the porosity of the nanostructured sub-layer, wherein having the nanostructures that are too dense or too porous negatively affects the fabrication of the composite materials (at the delamination step) and, potentially, the composite material's overall robustness in use.

In some embodiments, the nanostructures may also comprise an array of vertical or angled zig-zags, helices, blades, stacks of alternating thickness, or any combination thereof. In many embodiments, the height of the nanostructures (i.e., the thickness of the nanostructured sub-layer), or the width of the individual nanostructure units, or both, are adjusted or varied to ensure the most robust anchoring of the microdomains of the IR-reflecting material into the matrix. It should be noted that, in this application, the terms "height of the nanostructures" or "nanostructure height" are used to signify the average thickness of the overall nanostructured sub-layer, rather than the height/length of any individual column, such that the height of the nanostructured sub-layer comprising slanted (i.e., deposited at an angle) or any other types of columns may be different from the height/length of any individual column, or from the height of a sub-layer consisting of the same columns in an upright orientation. In many such embodiments, the height/thickness of the nanostructured anchoring sub-layer is less than 1 micron. In some such embodiments, the height (thickness) of the nanostructured sub-layer is approximately 90 nm. In many embodiments the IR-reflecting material of the deposition is one of: a metal, a metal or non-metal oxide, a ceramic, or any combination thereof, including alloys of thereof. In some such embodiments, the IR-reflecting material is one of: Cu, Al, $TiO_2$, $SiO_2$, or any combination thereof. In many embodiments, the support substrate for the deposition is one of: silicon wafer, aluminum foil, polymer, or glass.

In many embodiments, the fabrication of the composite material with adjustable spectral properties proceeds via deposition of an IR-transparent elastomer directly onto the overall IR-reflecting material layer, such that the nanoarchitectures of the nanostructured sub-layer become embedded (anchored) within the elastomer (FIG. 3A, middle) (see Drobny, J. G. Handbook of Thermoplastic Elastomers (Elsevier Oxford, ed. 2, 2014), Mark, J. E. Polymer Data Handbook (Oxford University Press, ed. 2, 2009), the disclosure of which is incorporated herein by reference). In many embodiments, the IR-transparent elastomer is deposited onto the IR-reflective material layer via one of the methods chosen from the list: spin coating, spray coating, slot-casting, offset printing, doctor blade coating, melt blowing, printing, extrusion, gravure coating, laminating, or any combination thereof. Here, it should be noted that, although any of the aforementioned deposition methods can be used equally effectively to deposit an elastomer during small scale production of the composite materials of the application, for the large scale or industrial setting manufacturing, the spray coating deposition of the elastomer layer may be the most practical, especially when used in conjunction with aluminum foil as the support substrate (FIG. 3B).

In many embodiments, the elastomer is both IR-transparent and has a low elastic modulus of less than $10^2$ MPa. In some embodiments, the elastic modulus is 2 MPa. In many embodiments, the elastomer comprises one of: polyethylene, polyurethane, polypropylene, polycarbonate, any block co-polymer with polystyrene, such as styrene-isoprene-styrene (SIS) or styrene-butylene-styrene (SBS), or any combination thereof. In many embodiments, the elastomer is a styrene-ethylene-butylene-styrene (SEBS) block co-polymer. In many embodiments the elastomer is deposited in a layer of less than 300 microns thick. In many embodiments, including wherein the matrix comprises a SEBS block co-polymer, the matrix is approximately 30 microns thick. In such embodiments, a sub-micron layer of elastomer is too fragile for proper operation of the composite material of the application. On the other hand, significantly increasing the thickness of the elastomer layer reduces its IR transparency, which also negatively affects the performance of the composite material of embodiments. In some embodiments, the IR-transparent elastomer is heat-treated following its application to the IR-reflective layer to ensure robust adhesion to the IR-reflecting material.

In many embodiments, the fabrication of the composite material with adjustable spectral properties is finalized by slow delamination (removal) of the IR-reflecting material-elastomer construct from the support substrate to obtain a free-standing composite film (FIG. 3A, right). In many embodiments, the delamination and handling process fractures the continuous IR-reflecting material sub-layer into IR-reflecting micro-domains separated by uncoated/bare IR-transparent elastomer, wherein the IR-reflecting micro-domains remain anchored into (or otherwise adhered to) the elastomer they immediately coat. In many embodiments, the overall fabrication process is robust and straightforwardly scalable, producing uniform, small or large-area composite materials with adjustable spectral properties in high yield. In some embodiments the composite material can be produced according to the laboratory scale methods of the instant disclosure as free standing films with area as large as 180 $cm^2$, or 900 $cm^2$, or even larger. However, in other embodiments, conventional industrial-scale manufacturing methods can be used to produce the composite materials with adjustable spectral properties on any commercially-relevant scale. In such embodiments, it is most practical to use aluminum foil as the support substrate and spray coating techniques for elastomer deposition. In addition, in many embodiments, employing adhesion methods that eliminate the need for nanostructure anchoring of the IR-reflecting material into the elastomeric matrix, such as, for example, chemical bonding, or interface surface roughening, may also facilitate large scale/industrial manufacturing.

Properties of the Composite Materials with Adjustable Spectral Properties

FIGS. 5A through 5D illustrate mechanical, optical, and spectral properties and characteristics of example composite materials prepared according to the embodiments from copper and SEBS elastomer. More specifically, these figures illustrate the tensile properties of the composite material and the effect of the applied strain (i.e. mechanical actuation) on its microstructure and IR-transparency. First, the engineering stress versus engineering strain curves shown in FIG. 5A indicate that the composite materials of the embodiments behave like soft and strong elastomers, with the Cu-SEBS composite material example demonstrating an average elastic modulus of ~2 MPa and an elongation at break of at least ~700%. Furthermore, in many embodiments, the composite materials in their relaxed state are visibly opaque and highly reflective to the naked eye/digital camera imaging (FIG. 5B1, top left), while their surfaces comprise a dense arrangement of abutting, irregularly-shaped domains of IR-reflecting material completely covering the underlying elastomeric matrix, as indicated by SEM (FIG. 5B1, middle left and bottom left, FIG. 5B2, top row, and FIG. 5B3, top row). However, upon application of slight strain (e.g., 30% strain as depicted in FIGS. 5B1, 5B2, and 5B3), the composite materials of embodiments become partially transparent and less reflective to the naked eye/digital camera (FIG. 5B1, top center), and their surface architecture changes to a sparser arrangement of IR-reflecting micro-domains, wherein the micro-domains are proximal to but not in direct contact with each another, revealing the underlying strained elastomer matrix, as confirmed by SEM (FIG. 5B1, middle center and bottom center, FIG. 5B2, middle row, and FIG. 5B3, middle row). Under further increased strain (e.g., to 50% as depicted in FIGS. 5B1, 5B2, and 5B3), the composite materials of the embodiments become even more transparent and less reflective to the eye/digital camera (FIG. 5B1, top right), while the arrangement of the IR-reflecting micro-domains becomes even more spread out, revealing more of the underlying IR-transparent matrix, as confirmed by SEM (FIG. 5B1, middle right and bottom right, FIG. 5B2, bottom row, and FIG. 5B3, bottom row). Importantly, the mechanical actuation experiments confirm that the composite materials of the embodiments can be loaded/unloaded in less than 1 s, and produce fully reversible changes in both their visible appearance and surface microstructure (FIGS. 5B1, 5B2, 5B3). In addition, the experiments confirm that the composite materials of embodiments withstand repeated mechanical cycling without any noticeable deterioration. Furthermore, the Cu-SEBS composite materials of embodiments demonstrate figures of merit comparable to those of the natural squid skin—i.e., analogous elastic modulus (~2 MPa (FIG. 5A) compared to ~0.5 to ~3 MPa of the chromatophore organ-containing dermal layer of squid skin), similarly rapid response time (less than 1 s for both), and capacity for extreme elongation (~700% (FIG. 5A) compared to >14-fold diameter expansion for chromatophore pigment cells. Accordingly, the composite materials of the embodiments exhibit several squid skin-like advantageous characteristics also desirable for thermal switching applications, including a rapid response time, a soft and flexible form factor, and a straightforward actuation mechanism.

FIGS. 5C1 through 5C4 provide data demonstrating how the composite material's IR reflectance and transmittance are dynamically modulated by means of an applied mechanical stimulus (here, a uniaxial strain) according to embodiments. Accordingly, in good correlation with the structural changes observed for the mechanically actuated and relaxed composite materials of embodiments (as described above), in their relaxed state, representative composite materials prepared according to the embodiments from copper and SEBS elastomer feature a high average total reflectance of ~100% (FIGS. 5C1 and 5C2, top left graph, top line, and FIGS. 5C1 and 5C2, bottom left graph) and a low average total transmittance of ~1% (FIGS. 5C1 and 5C2, top right graph, bottom line, and FIGS. 5C1 and 5C2, bottom right graph). In turn, under a strain of just 30%, the average total reflectance of the same composite materials drops to 77% (FIGS. 5C1 and 5C2, top left graph, middle line, and FIGS. 5C1 and 5C2, bottom graph), while the average total transmittance increases to 17% (FIGS. 5C1 and 5C2, top right graph, middle line, and FIGS. 5C1 and 5C2, bottom right graph). In addition, the IR transmittance spectra of the stretched composite materials feature peaks corresponding to atomic and functional group vibrations within the now exposed elastomeric matrix material (FIGS. 5C1 and 5C2, top right graph). For example, the stretched composite material of embodiments comprising SEBS matrix produces signals at ~6.3 μm (~1600 cm$^{-1}$), ~6.9 μm (~1450 cm$^{-1}$), ~12.6 μm (797 cm$^{-1}$), and ~14.5 μm (692 cm$^{-1}$), which correspond to stretching vibrations of the carbons in the aromatic rings of SEBS, deformation vibrations of the $CH_2$ groups in ethylene-butylene functionality of SEBS, deformation vibrations of the CH groups in the aromatic rings of SEBS, and out-of-plane bending of the CH groups in the SEBS aromatic rings, wherein all five hydrogen carbons oscillate in phase (FIGS. 5C1 and 5C2, top right graph) (see Munteanu, S. B., et al. Spectral and thermal characterization of styrene-butadiene co-polymers with different architectures. J. Optoelectron. Adv. Mater. 7, 3135-3148 (2005); and Allen, N. S. et al. Degradation and stabilisation of styrene-ethylene-butadiene-styrene (SEBS) block co-polymer. Polym. Degrad. Stab. 71, 113-122 (2001); the disclosure of which is incorporated herein by reference). Furthermore, increasing the strain to 50%, further drops the average total reflectance of the composite materials to an even smaller value of 67% (FIGS. 5C1 and 5C2, top left graph, middle line, and FIGS. 5C1 and 5C2, bottom left graph), increases the average total transmittance to 27% (FIGS. 5C1 and 5C2, top right graph, middle line, and FIGS. 5C1 and 5C2, bottom right graph), and also increases the intensity of the elastomer-associated spectroscopic signals (FIGS. 5C1 and 5C2, top right graph). Overall, the mechanical actuation experiments with the composite materials of embodiments indicate, that both the IR-reflectance and transmittance properties of the composite materials of embodiments possess a non-linear dependence on the strain. For example, in some embodiments, wherein the composite material comprises copper and SEBS, the IR-reflectance decreases by ~25±1%, ~34±1%, and ~46±2% at strains of 30%, 50%, and 100%, respectively (relative to the initial unstrained state), and the IR-transmittance increases by ~16±1%, ~25±1%, and ~40±2% at strains of 30%, 50%, and 100%, respectively (also relative to the initial unstrained state) (FIGS. 5C1 and 5C2, bottom left graph and bottom right graph). In addition, FIGS. 5C3 and 5C4 provide plots of average reflectance and average transmittance versus strain for composite materials fabricated under varying deposition conditions.

Figure 5A:
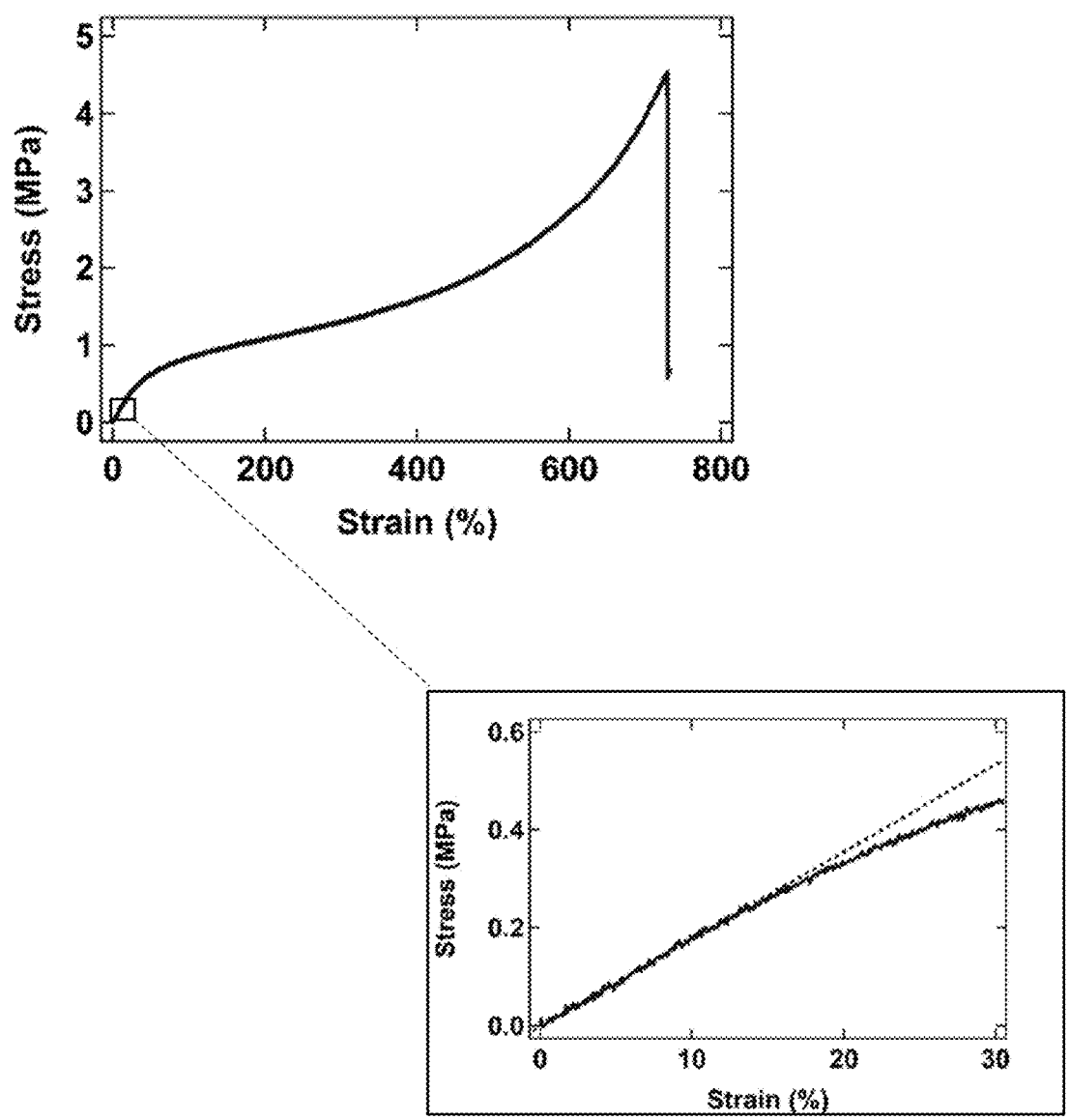
Figure 5D:
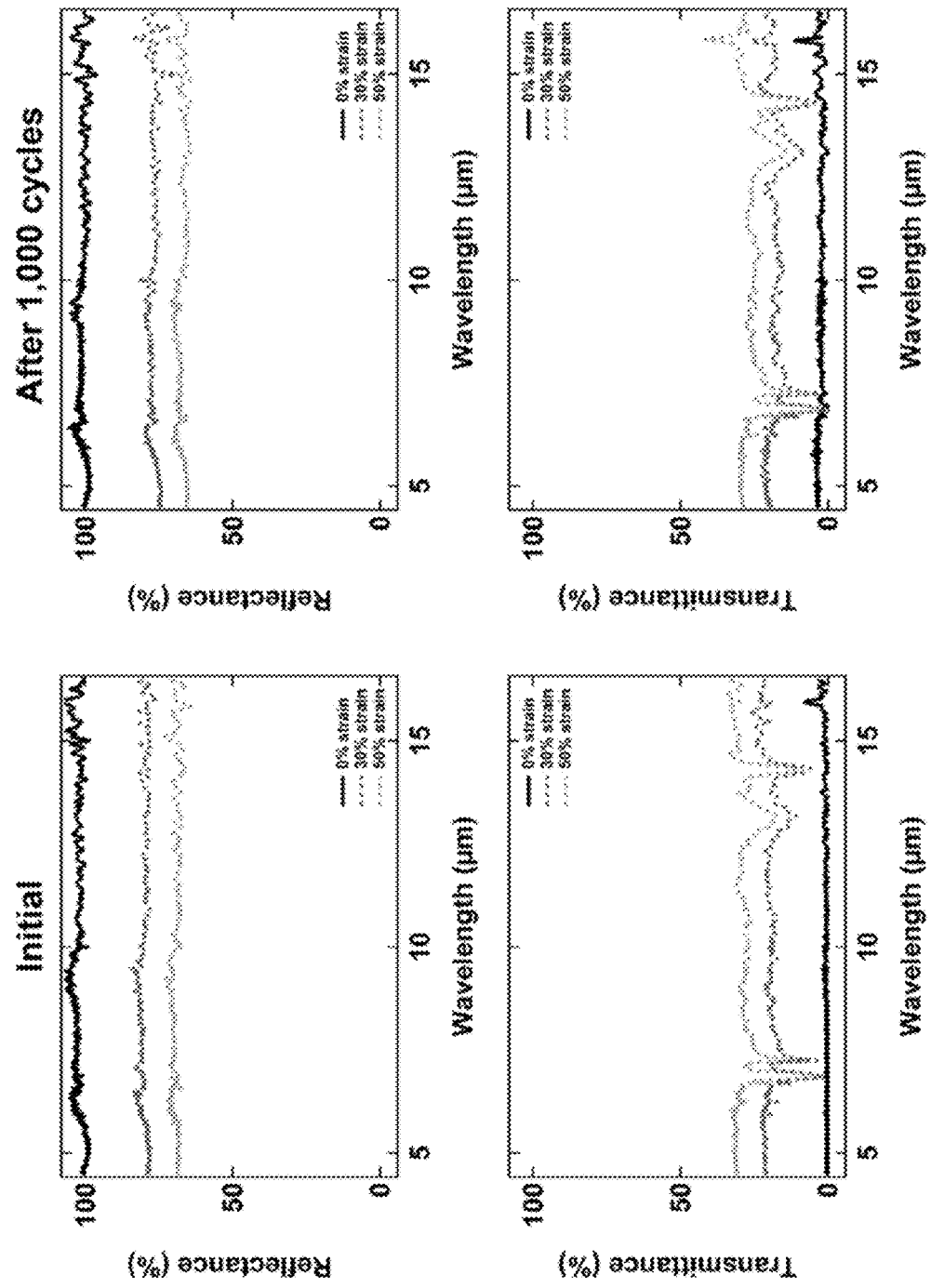

Finally, the composite materials of embodiments display fully reversible changes in their IR-reflectance and IR-transmittance upon mechanical actuation, as well as excellent global stability, with little-to-no degradation in capabilities after as many as $10^4$ actuation and relaxation cycles (FIG. 5D). Moreover, based on their transmittance at different strains, the mechanically-actuated composite materials of embodiments possess maximum on/off ratios of >30, which exceeds the best reported values for radiative thermal switches by an order of magnitude. Therefore, the composite materials of embodiments, again, demonstrate several key characteristics desired for thermal switching applications, including reversibility, stability, and high on/off ratios.

Figure 6A:
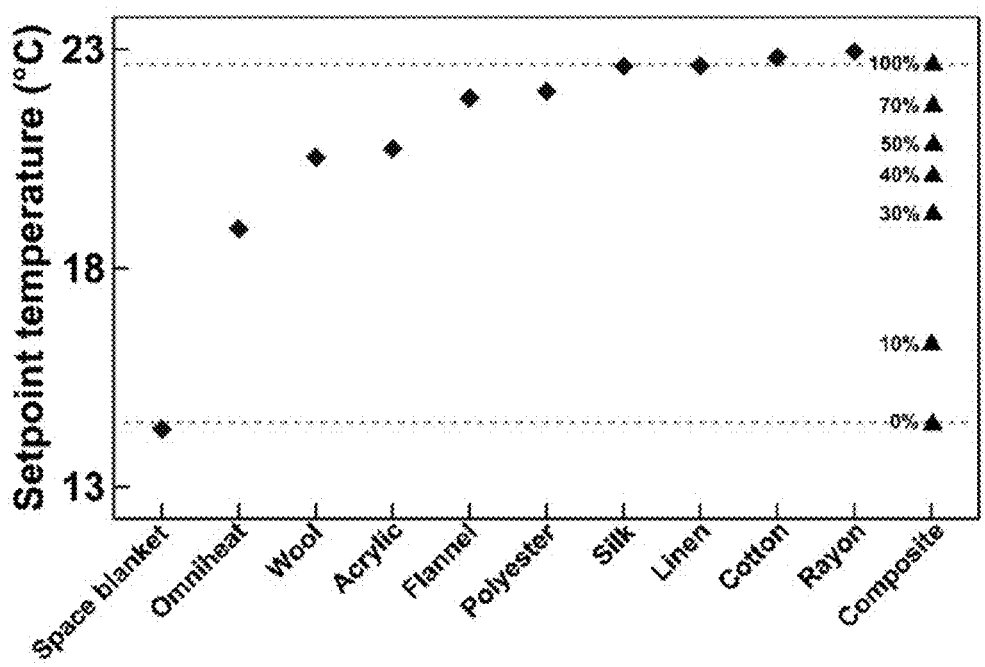
Figure 6B:
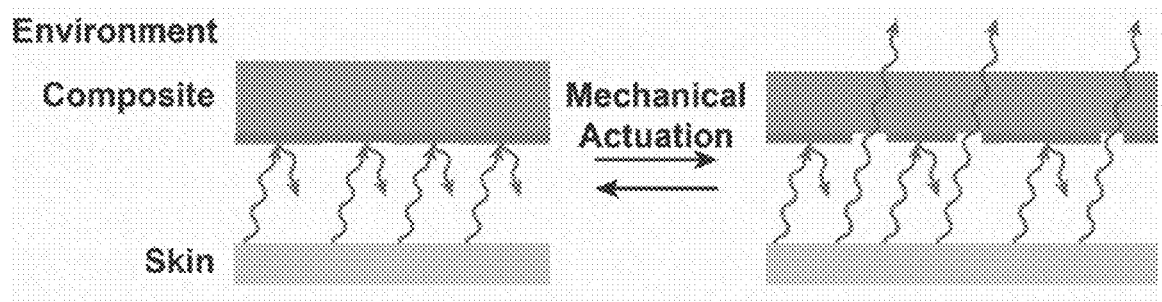

In many embodiments, the composite materials possess multi-modal switching capabilities, wherein their infrared properties can be modulated to mimic a variety of common materials and textiles. For example, FIG. 6A illustrates the operational temperature range of the Cu-SEBS composite materials of embodiments in the context of wearable applications, determined based on their measured IR-modulation abilities (as described above) and the heat transfer model depicted in FIG. 6B. In addition, FIG. 6A compares the modeled performance of the composite materials to similarly modeled performance of materials/fabrics commonly used in clothing (i.e. "static" wearable heat management systems). More specifically, FIG. 6B illustrates a rudimentary model for the transfer of heat (here, the heat naturally generated by human body) from skin, through a material (including through the composite materials of embodiments or another fabric), and to the surrounding cooler (than the skin) environment (FIG. 6B) (see Cai, L. et al. Warming up human body by nanoporous metallized polyethylene textile. Nat. Commun. 8, 496 (2017); and Tong, J. K. et al. Infrared-transparent visible-opaque fabrics for wearable personal thermal management. ACS Photonics 2, 769-778 (2015); the disclosures of which are incorporated herein by reference). For the composite material of embodiments, scenarios with and without mechanical actuation are considered. In this model, the environmental setpoint temperature (plotted on the y-axis of the graph in FIG. 6A) is defined as a temperature for which an individual wearing a material of choice remains thermally comfortable, i.e. maintains a constant skin temperature and unchanged outgoing heat flux regardless of the "outside" or "environmental" temperature.

Accordingly, based on this model and the experimental IR-modulation data collected for the composite materials of embodiments, in their fully relaxed state, the composite materials of embodiments comprised of Cu-SEBS components, have a setpoint temperature of ~14.5° C. (FIG. 6A, triangular data points), which is similar to the value of ~14.3° C. determined by the same method for the space blanket, i.e. the presumably lowest possible value for a near-perfect reflector (FIG. 6A, diamond data points). In other words, to remain thermally comfortable in a ~14.5° C. environment, an individual can don an article of clothing/outer layer based on either the space blanket-type material or the composite material of embodiments brought to a fully relaxed state. In turn, under a strain of 30%, the representative Cu-SEBS-based composite materials of embodiments have a setpoint temperature of ~19.6° C. (FIG. 6A, triangular data points), which is similar to the value of ~18.9° C. found for an Omniheat fleece lining (FIG. 6A, diamond data points). Following on the example provided above, an individual wishing to remain thermally comfortable through the environment temperature increase from ~14.5 to 18.9° C., will now have to either swap the space blanket outer layer for Omniheat fleece or simply adjust the strain within the composite material of embodiments without taking it off, depending on the original choice of thermoregulation. Further, under an increased strain of 50%, the representative Cu-SEBS-based composite materials of embodiments have a setpoint temperature of 21.0° C. (FIG. 6A, triangular data points), which is similar to the value of ~20.5° C. determined for wool (FIG. 6A, diamond data points). Under an even greater strain of 100%, the representative Cu-SEBS-based composite materials of embodiments have a setpoint temperature of ~22.7° C. (FIG. 6A, triangular data points), which is similar to the value of ~22.8° C. found for cotton (FIG. 6A, diamond data points). Therefore, FIG. 6A clearly shows that, in many embodiments, the composite materials of the application can be instantaneously adjusted by mechanical means to maintain a wearer's thermal comfort across an environmental setpoint temperature window of as large as ~8.2° C. (and potentially larger with a more IR-transparent matrix or higher strains), and, as such, represents a practical multi-functional replacement for a wide range of thermoregulatory materials and textiles. In addition, FIGS. 6C and 6D directly compare the calculated setpoint temperatures for the composite materials fabricated under varying deposition conditions.

Figure 7A:
FIGS. 7A-7C illustrate experimental setup (FIG. 7A), experimental schematic (FIG. 7B), and spectral and optical data (FIG. 7C) corresponding to the evaluation of the thermoregulatory functionality of the composite materials at various stages of actuation, in accordance with embodiments of the application.
Figure 7A:
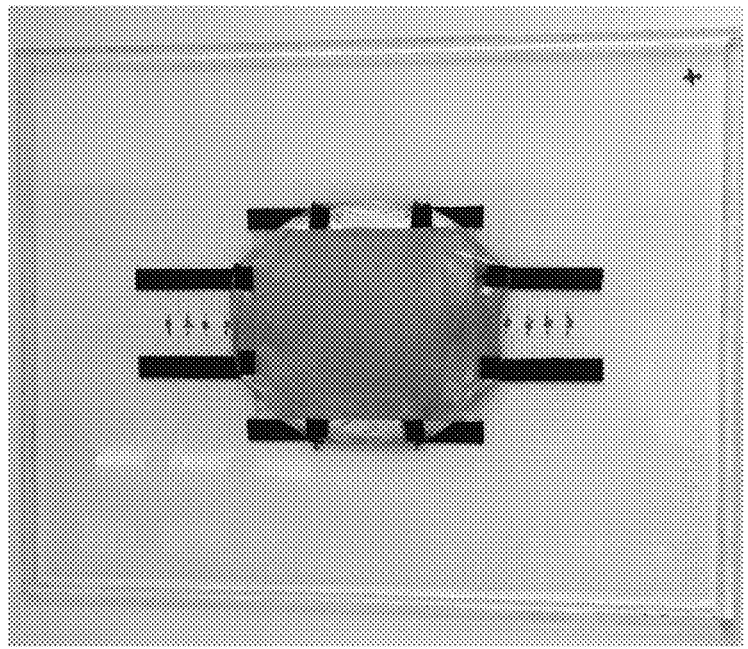
Figure 7B:
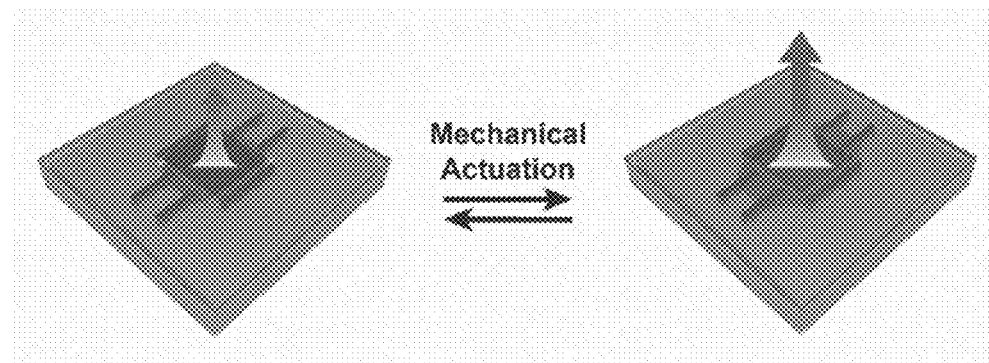
Figure 7C:
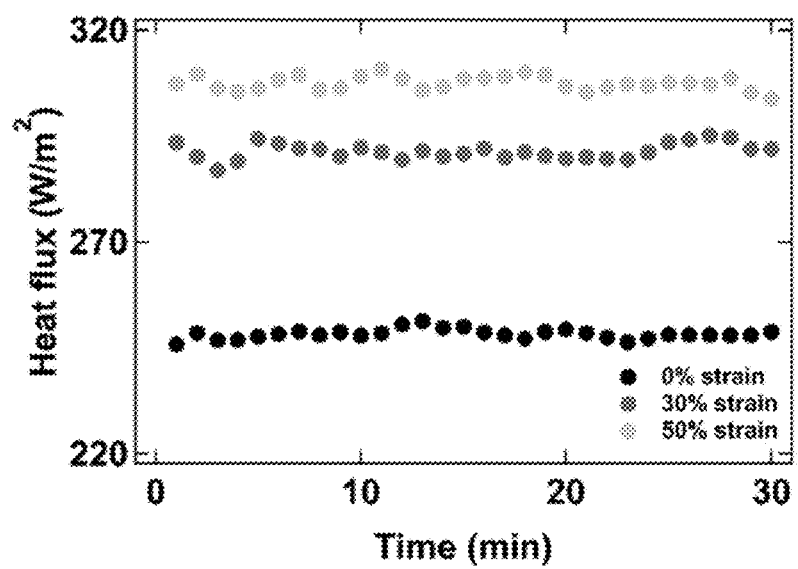
Figure 7C:
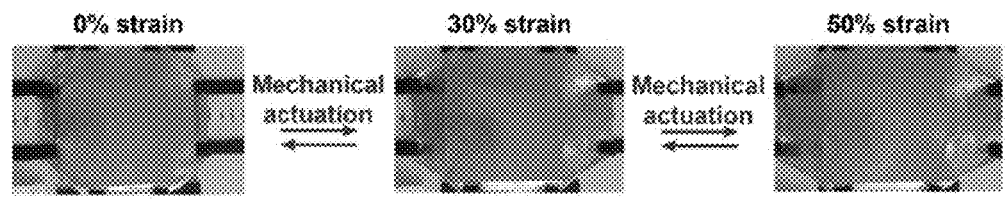

Furthermore, in many embodiments, the composite materials of the application can manage the transfer of heat from skin in an adaptive and efficient manner. For example, FIGS. 7A through 7C illustrate heat transfer experiments conducted with the Cu-SEBS-based composite materials of embodiments applied to a surface designed to approximate the thermal properties of human skin. More specifically, the composite materials were mounted in a custom-designed holder (FIG. 7A) that allowed for application of strain over a sweating guarded hot plate and their thermoregulatory capability was tested under controlled conditions without and with mechanical actuation (FIG. 7B). Per these experiments, it appears that in the relaxed state, the representative Cu-SEBS-based composite materials of embodiments maintain the heat flux from the hot plate at an average value of ~248 W/m$^2$ (FIG. 7C, bottom plot line). In turn, under a strain of 30%, the representative Cu-SEBS-based composite material maintains the heat flux from the hot plate at a higher average value of ~291 W/m$^2$ (FIG. 7C, middle plot line), which rises to an even higher average value of ~307 W/m$^2$ under an increased strain of 50% (FIG. 7C, top plot line).

Overall, in many embodiments, the representative Cu-SEBS-based composite materials of the application are able to stably modulate the heat flux by ~36±8 W/m$^2$ and ~51±8 W/m$^2$ upon actuation with applied strains of 30% and 50%, respectively. Therefore, in many embodiments, the composite materials of embodiments are capable of adaptively managing at least one quarter of the metabolic heat expected to be generated by the skin of a resting sedentary individual, which is estimated to be ~73 W/m$^2$. In many embodiments, even better performance is achievable at higher strains and/or higher transmittance matrix. Furthermore, in many embodiments, the composite materials only need an input of 3 W/m$^2$ for a single moderate strain mechanical switching event and do not consume power continuously. Consequently, in many embodiments, the energy requirement for operating the composite material with adjustable spectral properties is very low, and is substantially lower than that of any currently available active thermal management platforms. Accordingly, in many embodiments, the composite materials demonstrate key advantages of both passive and active thermoregulating systems by exhibiting excellent energy efficiency and ease of operation, while simultaneously allowing for robust user control.

Figure 9:
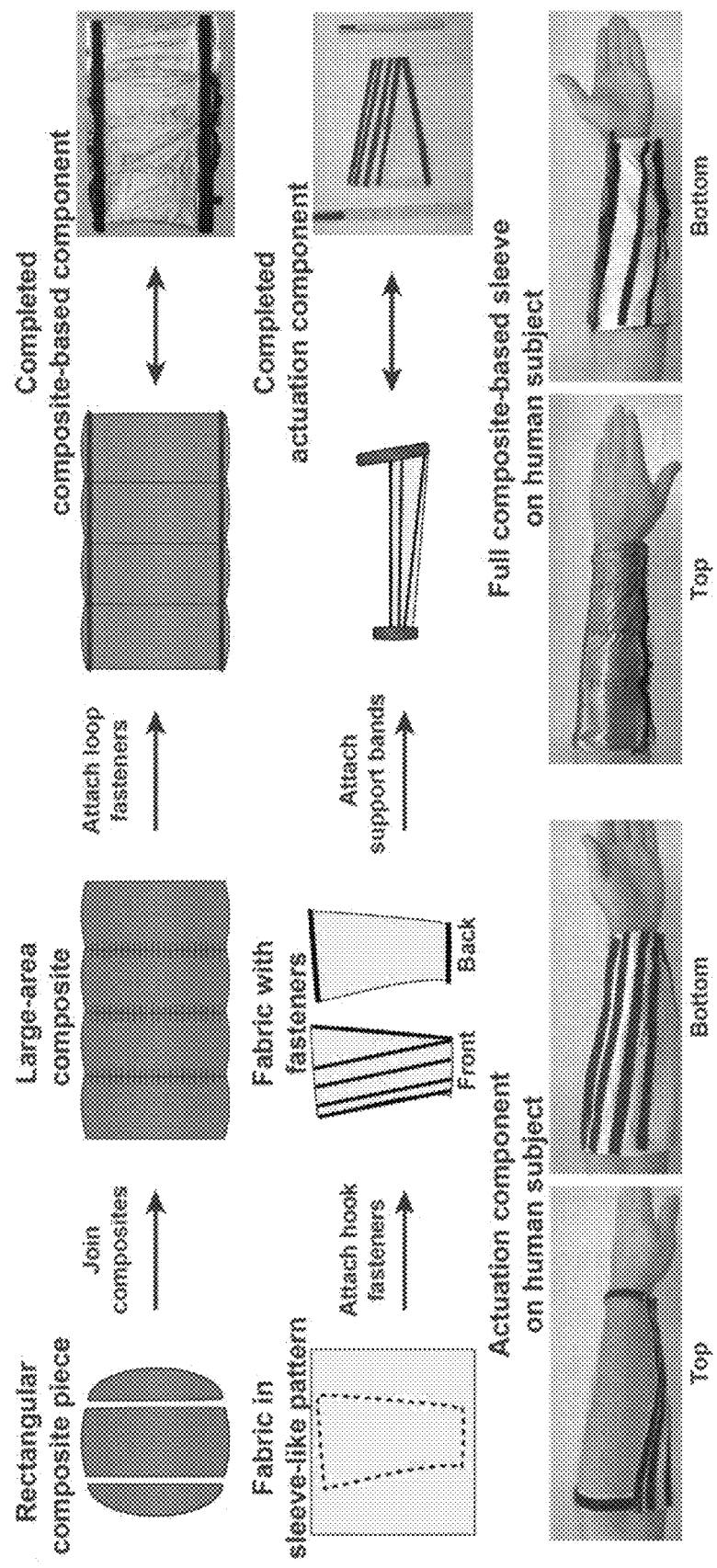
FIG. 9 illustrates the design and fabrication of a thermoregulatory sleeve based on the composite material with adjustable spectral properties, in accordance with embodiments of the application.

In many embodiments, the composite materials with adjustable spectral properties function as dynamic switchable components in wearable systems and directly manage the local body temperature of human subjects. In many such embodiments, the composite materials are used in heat regulating clothing or clothing components. For example, FIGS. 8A through 8C illustrate operation and adjustable heat-regulating capabilities of a sleeve prepared from the Cu-SEBS-based composite material of embodiments (FIG. 9) and compare it to an analogous sleeve made from space blanket material. First, a sleeve comprising the composite material was designed to allow for the application of strain via a straightforward fastener mechanism according to some embodiments (FIG. 9). Next, the designer "adjustable" sleeve was fabricated from both the composite materials of embodiments and, for comparison, from the space blanket material, and fitted onto one of the forearms of a human subject for testing of heat regulating properties (FIGS. 8A and 9). Finally, the outgoing heat flux and the change in temperature for the subject's sleeve covered forearm were visualized and measured throughout the actuation stages of the sleeve and compared to the analogous data for the bare forearm serving as an internal standard (FIGS. 8A-8C).

According to these experiments, the collected data for some of which is provided in FIGS. 8B and 8C, a completely static sleeve made from the space blanket material traps (i.e. primarily reflects back) most of the heat emitted by the forearm it covers (FIG. 8B, left arm) and, thus, raises the temperature of the covered forearm's by ~1.0±0.1° C., as compared to the bare forearm (FIG. 8C). Similarly, in many embodiments, the composite material-based sleeve in its fully relaxed state also traps the heat emitted by the skin it covers (FIG. 8B, left arm) and, as such, raises the covered forearm's temperature by ~0.9±0.1° C., as compared to the bare forearm (FIG. 8C), similarly to the space blanket-based sleeve. However, in many embodiments, when a strain of 30% is applied to the composite material-based adjustable sleeve, it traps only some of the heat emitted by the forearm it covers (FIG. 8B, left arm) and raises the covered forearm's temperature only by ~0.3±0.1° C., as compared to the bare forearm (FIG. 8C), which constitutes a >2-fold reduction in temperature change with respect to that for the space blanket. Furthermore, in many embodiments, application of 50% strain leads the composite material-based sleeve trapping substantially less heat emitted by the covered forearm (FIG. 8B, left arm) and raises the covered forearm's temperature by only ~0.1±0.1° C., as compared to the bare forearm (FIG. 8C), which constitutes a ~10-fold reduction in temperature change with respect to that for the space blanket.

Accordingly, in many embodiments, the composite material-based sleeve or another wearable component or article of clothing can be mechanically adjusted with good control in real time to locally manage the heat flux from a wearer to the surrounding environment. In many such embodiments, the relative temperature change in response to the mechanical modulations is nearly an order of magnitude (FIG. 8C). Moreover, in many embodiments, the mechanically affected temperature changes are ~2- to ~5-fold greater than the temperature difference perception thresholds (i.e., <0.1° C.) found in studies of human subjects (see Stevens, J. C., et al. Temperature sensitivity of the body surface over the life span. Somatosens. Mot. Res. 15, 13-28 (1998), the disclosure of which is incorporated herein by reference). Therefore, in many embodiments, the heat regulation range that can be achieved by the composite materials of the application as they proceed through various states of actuation is readily perceivable by users. In many embodiments, the composite materials of the application are incorporated in garments that adaptively and selectively regulate the thermal envelope across a wearer's entire body.

Examplary Embodiments

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Celsius, and pressure is at or near atmospheric. Standard abbreviations may be used, e.g., s or sec, second(s); min, minute(s); h or hr, hour(s); and the like.

EXAMPLE 1

Fabrication of the Composite Material

The composite materials are prepared according to standard microfabrication protocols. First, to prepare the IR-reflecting layer, a ~20 nm planar copper (Kurt J. Lesker) film and a ~90 nm array of tilted columns are sequentially electron beam evaporated onto a 6-inch diameter silicon wafer (University Wafer) by using an Angstrom Engineering EvoVac system. Next, to embed the nanostructured layer within an IR-transparent elastomer, a ~30 µm thick film from a commercially-available styrene-ethylene-butylene-styrene block co-polymer (G1645 SEBS, Kraton Polymers LLC) is spincast directly onto the nanostructure-modified substrate. Last, the composite is cured on a hot plate at 60° C. for 10 minutes and then delaminated from the substrate by means of a Mylar frame and pressure-sensitive tape. The resulting composite materials obtained via this procedure are used for physical, mechanical, optical, and infrared characterization experiments as needed.

EXAMPLE 2

Fabrication of Composite Materials with Large Areas

The composite materials with large areas are prepared according to standard microfabrication protocols. First, to prepare the IR-reflecting layer, a ~20 nm planar copper (Kurt J. Lesker) film and a ~90 nm array of tilted columns is sequentially electron beam evaporated onto a 12-inch diameter substrate covered in aluminum foil by using an Angstrom Engineering EvoVac system. Next, to embed the nanostructured layer within an IR-transparent elastomer, a ~20-30 µm thick film from a commercially-available styrene-ethylene-butylene-styrene block co-polymer (G1645 SEBS, Kraton Polymers LLC) in toluene is spray coated in layers directly onto the nanostructure-modified substrate. Last, the composite is either cured on a hot plate at 60° C. for 10 minutes or allowed to sit at room temperature until the solvent has evaporated, then delaminated from the substrate by means of a Mylar frame and pressure-sensitive tape. The resulting composite materials obtained via this procedure are used for physical, mechanical, optical, and infrared characterization experiments as needed.

EXAMPLE 3

Fabrication of Wearable Sleeves from the Composite Materials

The wearable adaptive thermal management sleeves, which comprise a composite material component and a fabric-based actuation component, are designed and manufactured via protocols developed in-house (FIGS. 9A & 9B). To prepare the composite material component, four circular samples of the composite material with a ~6 inch diameter are first segmented into rectangular pieces with a ~5.5 inch length and a ~2.5 inch width. The four rectangular pieces are then joined together with adhesive tape to form a larger section with a ~10 inch length and a ~5.5 inch width. The larger section is, in turn, modified with hook fasteners (from a commercial hook-and-loop fastener set) along its periphery, in order to enable integration with the fabric-based component and allow for the application of different strains. To prepare the fabric-based actuation component, a square sample of a stretch woven fabric is first cut into a sleeve-like pattern. The resulting fabric swatch is then modified with loop fasteners (from the same commercial hook-and-loop fastener set) at predetermined positions, which are selected to correspond to the application of strains of 0%, 10%, 30%, and 50% to the composite-based component. The fabric swatch is, in turn, modified with bands, which encircled the forearm to provide structural support and simultaneously function as rail guides to prevent the composite material component from directly contacting the skin. To complete the wearable adaptive thermal management sleeve, the fabric-based actuation component is mounted on the forearm of a human subject, and the composite material component is then attached to its fabric-based counterpart via the complementary hook-and-loop fastener assembly.

EXAMPLE 4

Characterizations of the Composite Materials

Scanning electron microscopy of the composite materials after the fabrication steps. The morphology of the composite materials is characterized via scanning electron microscopy (SEM) by using a Magellan 400 XHR SEM (FEI). For imaging of the nanostructured sub-layer, the pristine samples are not modified. For cross-sectional imaging of the interior of the composite material, a portion of the elastomer is removed with a Hitachi IM4000 Plus Ion Milling System. For imaging of the IR-reflecting micro-domains at various strains, the samples are subjected to the appropriate strain fixed with an epoxy resin (Ted Pella), and sputter coated with a ~2 nm film of platinum/palladium on a Leica ACE200 Vacuum Coater. Such characterization ensures quality control and standardization during the fabrication and testing steps.

Elemental mapping of the composite materials. The chemical composition of the composite materials' surfaces is characterized via energy dispersive spectroscopy by using a Magellan 400 XHR SEM outfitted with an Oxford Instruments X-Max Silicon Drift Detector. For these measurements, the samples are subjected to various strains, fixed with an epoxy resin, and sputter coated with a ~2 nm film of platinum/palladium. The resulting elemental maps if IR-reflective material are analyzed by using the ImageJ (NIH) software package and are consistent with expectations from the SEM experiments. Such characterization further confirm the chemical identity of the IR-reflective micro-domains covering the surface of the elastomer.

Infrared spectroscopy of the composite materials and fabrics/textiles. The infrared properties of the composite materials and various fabrics/textiles are characterized via infrared spectroscopy by using a PerkinElmer Fourier Transform Infrared (FTIR) Spectrometer outfitted with a Pike Technologies Mid-infrared Integrating Sphere. The measurements furnish the total (sum of diffuse and specular) reflectance and transmittance (see Hanssen, L. M., et al. Infrared Optical Properties of Materials. NIST Spec. Publ. 250, (2015), the disclosure of which is incorporated herein by reference) and are referenced to a Pike Technologies Diffuse Gold Standard, when appropriate. During the experiments, all samples are mounted on home-built size-adjustable stages, which allows for mechanical actuation, i.e. the application of different uniaxial strains, as necessary. The samples tested include rayon, cotton, linen, silk, polyester, cotton flannel, acrylic, wool felt, the Columbia Omniheat fleece, the space blanket, and the composite material of embodiments. The tested areas are large enough to completely cover the ~2.1 cm diameter instrument port before and after mechanical actuation. The total transmittance spectra are collected at a normal illumination angle, and the total reflectance spectra are collected at an illumination angle of 12°. The collected spectra are analyzed with the Spectrum (PerkinElmer) and Igor Pro (Wavemetrics) software packages, and all average values are calculated over the wavelength range of 4.5 to 16.5 µm. The experiments are performed for more than ten different samples.

Thermal evaluation of the composite materials. The thermal properties of the composite materials are characterized according to standard protocols (see ASTM Standard F1868: Standard Test Method for Thermal and Evaporative Resistance of Clothing Materials Using a Sweating Hot Plate. ASTM Int. (2017), the disclosure of which is incorporated herein by reference) by using a Thermetrics SGHP-8.2 Sweating Guarded Hot Plate located within a temperature- and humidity-controlled chamber. During the experiments, all samples are mounted on custom-designed holders, which allows for them to be maintained under different applied uniaxial strains on the hot plate. The measurements furnish the thermal flux from the hot plate necessary to maintain its temperature at a constant value, as well as the thermal resistance of the sample being tested. For the measurements, the hot plate is covered with skin tape (Trimaco) and kept at a representative human skin-like temperature of 35° C.; the surrounding chamber is maintained at a representative environmental temperature of 19.5° C. and a representative relative humidity of 50%; and the sample is maintained under a laminar air flow of 1 m/s. The average values of the thermal flux are calculated from multiple independent measurements performed over a period of 30 minutes for both strained and unstrained samples. The collected data is analyzed with Igor Pro (Wavemetrics) software package. The experiments are performed for more than three different samples.

Tensile testing of the composite materials. The tensile properties of the composite materials are characterized according to standard protocols (see ASTM Standard D882: Standard Test Method for Tensile Properties of Thin Plastic Sheeting. ASTM Int. (2012), the disclosure of which is incorporated herein by reference) by using an Instron 3365 Universal Testing System. During the experiments, samples with a 3 inch length, 0.5 inch width, and 30 µm thickness are mounted on the grips of the instrument at an initial separation of 1 inch. The measurements furnish the load versus the elongation, enabling calculation of the engineering stress as a function of the engineering strain. The engineering stress ($\sigma$) is calculated according to the equation:

$$\sigma = F/A$$

where F is the applied load and A is the area of the sample. The engineering strain ($\varepsilon$) is calculated according to the equation:

$$\varepsilon = \Delta L/L$$

where $\Delta L$ is the change in length of the sample and L is the initial length of the sample. The Young's modulus (E) is calculated from the linear region of the engineering stress versus the engineering strain (at low strain) by using the following equation:

$$E = \sigma/\varepsilon$$

where E is the slope of the elastic (linear) region (FIG. 5A). The experiments are performed for more than ten different samples.

Stability testing of the composite materials. The mechanical stability of the composite materials is characterized by using a MARK-10 ESM303 Tension/Compression Test Stand, in conjunction with a PerkinElmer FTIR Spectrometer outfitted with a Pike Technologies Mid-infrared Integrating Sphere. First, the samples' total IR reflectance and transmittance are measured at uniaxial strains of 0%, 30%, and 50%, as described above. Next, the samples are cycled one thousand times between applied strains of 0% and 50%. In turn, the samples' total IR reflectance and transmittance are again measured at uniaxial strains of 0%, 30%, and 50%, as described above. Subsequently, the samples are cycled another nine thousand times between applied strains of 0% and 50%. Last, the samples' total IR reflectance and transmittance are once again re-measured at uniaxial strains of 0%, 30%, and 50%. The experiments are performed for more than five different samples.

Analysis of heat transfer through the composite materials or cloth. The thermal properties of the composite materials are computationally evaluated according to procedures adapted from the literature. For this purpose, the steady state, one-dimensional heat transfer (via conduction, convection, and radiation) between a planar heat source that emulates human skin, the composite material or cloth, and the surrounding environment are modeled for the general configuration shown in FIG. 6B by using the set of equations described below. The absorptance ($\alpha$) is calculated according to the equation:

$$\alpha = 1 - \tau - \rho$$

where $\tau$ is the transmittance and $\rho$ is the reflectance. The emittance ($\varepsilon$) is calculated by using Kirchoff's Law of Thermal Radiation according to the equation:

$$\varepsilon = \alpha = 1 - \tau - \rho$$

where $\alpha$ is the absorptance, $\tau$ is the transmittance, and $\rho$ is the reflectance. The heat transferred from the skin via radiation ($q_{rad,s}$) is calculated by using the Stefan-Boltzmann Law according to the equation:

$$q_{rad,s} = \varepsilon_s \sigma T_s^4$$

where $\sigma$ is the Stefan-Boltzmann constant, $\varepsilon_s$ is the emittance of the skin, and $T_s$ is the temperature of the skin.

$$q_{rad,e} = \varepsilon_e \sigma T_e^4$$

$\varepsilon_e$ is the emittance of the environment, $T_e$ is the temperature of the environment, $$q_{rad,i} = \varepsilon_i \sigma T_i^4$$

$\varepsilon_i$ is the emittance of the inner side of the cloth, $T_i$ is the temperature of the inner side of the cloth, $$q_{rad,o} = \varepsilon_o \sigma T_o^4$$

$\varepsilon_o$ is the emittance of the outer side of the cloth, and $T_o$ is the temperature of the outer side of the cloth. The heat transferred across the air gap by conduction ($q_{cond,a}$) is calculated by using Fourier's Law according to the equation:

$$q_{cond,a} = \frac{k \Delta T}{\Delta x} = \frac{k_a}{t_a}(T_s - T_i)$$

where $k_a$ is the thermal conductivity of the air gap, $t_a$ is the thickness of the air gap, $T_s$ is the temperature of the skin, and $T_i$ is the temperature of the inner side of the cloth. The heat transferred from the outer surface of the composite (or cloth) to the surroundings $q_{conv}$ is assumed to obey Newton's Law of Cooling and was given by the equation:

$$q_{conv} = h \Delta T = h(T_o - T_e)$$

where h is the convective heat transfer coefficient, $T_o$ is the temperature of the outer side of the cloth, and $T_e$ is the temperature of the environment. The energy balance across the skin is given by the equation:

$$q_{gen} = (1 - \rho_i) q_{rad,out,s} + q_{rad,i} + \tau_c q_{rad,e} - q_{cond,a}$$

where $q_{gen}$ is the heat flux generated from the human body, $q_{rad,out,s}$ is the total radiation from the skin, $\rho_i$ is the reflectance on the inner side of the cloth, $q_{rad,i}$ is the radiation from the inner side of the cloth, $\tau_c$ is the transmittance of the cloth, $q_{rad,e}$ is the radiation from the environment, and $q_{cond,a}$ is the conduction across the air gap. The energy balance across the textile is given by the equation:

$$(1 - \rho_i - \tau_c) q_{rad,s} + (1 - \rho_o - \tau_c) q_{rad,e} - q_{rad,o} - q_{rad,i} + q_{cond,a} - q_{conv}$$

where $\rho_i$ is the reflectance on the inner side of the cloth, $\tau_c$ is the transmittance of the cloth, $q_{rad,s}$ is the radiation from the skin, $\tau_o$ is the reflectance on the outer side of the cloth, $q_{rad,e}$ is the radiation from the environment, $q_{rad,o}$ is the radiation from the outer side of the cloth, $q_{rad,i}$ is the radiation from the inner side of the cloth, $q_{cond,a}$ is the conduction across the air gap, and $q_{conv}$ is the convection into the environment. The temperature profile across the cloth (T(x)) is given by the equation:

$$T(x) = \frac{1}{2 k_c t_c}(q_{rad,i} + q_{rad,o} - \varepsilon_i q_{rad,out,s} - \varepsilon_o q_{rad,e}) x^2 - \frac{k_a}{k_c}\left(\frac{T_s - T_i}{t_a}\right)x$$

where $k_c$ is the thermal conductivity of the cloth, $t_c$ is the thickness of the cloth, $q_{rad,i}$ is the radiation from the inner side of the cloth, $q_{rad,o}$ is the radiation from the outer side of the cloth, $\varepsilon_i$ is the emittance from the inner side of the cloth, $q_{rad,out,s}$ is the total radiation from the skin, $\varepsilon_o$ is the emittance from the outer side of the cloth, $q_{rad,e}$ is the radiation from the environment, $k_a$ is the thermal conductivity of air, $T_s$ is the temperature of the skin, and $T_i$ is the temperature of the inner side of the cloth. The temperature on the outer side of the cloth ($T_o = T(t_a)$) is given by the equation:

$$T_o = \frac{t_c}{2 k_c}(q_{rad,i} + q_{rad,o} - \varepsilon_i q_{rad,out,s} - \varepsilon_o q_{rad,e}) - \frac{k_a t_c}{k_c t_a}(T_s - T_i)$$

where $t_c$ is the thickness of the cloth, $k_c$ is the thermal conductivity of the cloth, $q_{rad,i}$ is the radiation from the inner side of the cloth, $q_{rad,o}$ is the radiation from the outer side of the cloth, $\varepsilon_i$ is the emittance from the inner side of the cloth, $q_{rad,out,s}$ is the total radiation from the skin, $\varepsilon_o$ is the emittance from the outer side of the cloth, $q_{rad,e}$ is the radiation from the environment, $k_a$ is the thermal conductivity of air, $t_a$ is the thickness of the air gap, $T_s$ is the temperature of the skin, and $T_i$ is the temperature of the inner side of the cloth. The heat radiated from the skin ($q_{rad,out,s}$) is given by the equation:

$$q_{rad,out,s} = q_{rad,s} + (1 - \varepsilon_s)\left(\frac{q_{rad,i} + \rho_i q_{rad,s} + \tau_c q_{rad,e}}{1 - \rho_i(1 - \varepsilon_s)}\right)$$

where $q_{rad,s}$ is the radiation from the skin, $\varepsilon_s$ is the emittance of the skin, $q_{rad,i}$ is the radiation from the inner side of the cloth, $\rho_i$ is the reflectance from the inner side of the cloth, $\tau_c$ is the transmittance of the cloth, and $q_{rad,e}$ is the radiation from the environment.

From the three equations illustrating the overall heat transfer of the system (i.e. the energy balance across the skin (Equation 1), the energy balance across the textile (Equation 2), and the temperature on the outer side of the cloth (Equation 3)) and the definitions described above, the setpoint temperature ($T_e$) is calculated. For the purpose of the calculations, the use case is considered a human wearing a loose-fitting garment where the air gap thickness ($t_a$) is 5 mm. The convective heat transfer coefficient (h) is calculated as 7.3 W/m². In this calculations, the environment is approximated as a black body with an emissivity of ε=1, and the skin is approximated as a gray body with an emissivity of ε=0.98. Moreover, thermal comfort is defined as the conditions under which the total heat generation rate and total heat dissipation rate are equal, and the setpoint temperature is defined as the environmental temperature at which a sedentary individual remains comfortable (i.e. maintains a constant skin temperature of 35° C. and a steady state heat generation of 73 W/m²). Due to its high reflectance, the space blanket is used as the internal reference for normalization of the total reflectance and total transmittance values measured for the composite materials and fabrics/textiles (in place of the Pike Technologies Diffuse Gold Standard). Therefore, from the above equations, the setpoint temperature of the environment ($T_e$) is calculated for the composite materials from their average measured reflectance and transmittance values at strains of 0%, 10%, 30%, 40%, 50%, 70%, and 100%. In addition, the setpoint temperature is calculated for rayon (average transmittance of 7.4% and average reflectance of 11.7%), cotton (average transmittance of 7.8% and average reflectance of 13.1%), linen, (average transmittance of 4.3% and average reflectance of 13.0%), silk (average transmittance of 4.8% and average reflectance of 13.8%), polyester (average transmittance of 2.8% and average reflectance of 16.9%), flannel (average transmittance of 1.2% and average reflectance of 14.4%), acrylic (average transmittance of 4.3% and average reflectance of 13.0%), wool (average transmittance of 1.2% and average reflectance of 9.8%), the Omniheat fleece (average transmittance of 0.7%, average reflectance of 41.3% on the inner side, and average reflectance of 20.9% on the outer side), and the space blanket (average transmittance of 0.6%, average reflectance of 99.4% on the inner side, and average reflectance of 52.5% on the outer side). The calculations yield setpoint temperatures of 14.5° C., 16.4° C., 19.6° C., 20.2° C., 21.0° C., 21.8° C., and 22.7° C. for composite materials of embodiments under strains of 0%, 10%, 30%, 40%, 50%, 70%, and 100%, respectively, as well as setpoint temperatures of 23.0° C., 22.8° C., 22.6° C., 22.6° C., 22.0° C., 21.9° C., 20.7° C., 20.5° C., 18.9° C., and 14.3° C. for rayon, cotton, linen, silk, polyester, flannel, acrylic, wool, the Omniheat fleece, and the space blanket, respectively.

Analysis of the power consumed during composite actuation. The power consumption associated with actuation of the composite materials is estimated according to standard procedures. First, the energy density (U) for the composites is calculated from the stress versus strain curve according to the equation:

$$U = \int_{\varepsilon_i}^{\varepsilon_f} \sigma d\varepsilon$$

where σ is the stress, $\varepsilon_i$ is the initial strain, and $\varepsilon_f$ is the strain corresponding to an elongation of 30%. Next, the power consumption (P) is calculated from the equation:

$$P = \frac{U}{t}$$

where t is the time required for actuation.

Human subject testing of the composite material- and space blanket-based sleeves. The thermoregulatory properties of the composite material-based sleeves are evaluated for human subjects by using a FLIR C2 Infrared Camera. First, the bare forearms of a human subject are allowed to equilibrate in a controlled environment, and both forearms are imaged to record their average initial temperature. Next, the composite material-based sleeve is mounted on one of the forearms, with the composite material-based component attached at a loop fastener position corresponding to the absence of strain, and both the bare and sleeve-covered forearms are allowed to equilibrate for a period of ten minutes. In turn, the composite material-based sleeve is removed from the previously-covered forearm, and both forearms are imaged again to record their final average temperature. Last, the same sequence of measurements is repeated with the composite material-based component attached at a loop fastener position corresponding to different applied strains of ~10%, ~30%, and ~50%. From these measurements, the relative change in temperature (ΔT) for the human subject's sleeve-covered forearm with respect to their bare forearm, which serves as a de facto internal standard, is calculated according to the equation:

$$\Delta T = \Delta T_{covered} - \Delta T_{bare} = (T_{covered,final} - T_{covered,initial}) - (T_{bare,final} - T_{bare,initial}),$$

where $\Delta T_{covered}$ is the average temperature change for the covered forearm, $\Delta T_{bare}$ is the average temperature change for the bare forearm, $T_{covered,final}$ is the average final temperature for the covered forearm, $T_{covered,initial}$ is the average initial temperature for the covered forearm, $T_{bare,final}$ is the average final temperature for the bare forearm, and $T_{bare,initial}$ is the average initial temperature for the bare forearm. For the presented measurements, the human subject is a 24-year old male, and the surrounding room is maintained at a temperature of ~17.5 to ~18.5° C. The collected data and average forearm temperatures are calculated directly from the obtained videos and images by using the FLIR Tools+ (FLIR) and ImageJ (NIH) software packages. The thermoregulatory properties of the space blanket-based sleeves are evaluated by following nearly identical protocols to those described above. All variants of the experiments are performed for more than seven different sleeves.

In summary, the analysis of the properties of the composite materials with adjustable spectral properties fabricated according to embodiments confirms that these materials represent a viable platform for IR-regulation, including for applications in thermoregulating wearables and clothing. In many embodiments, the composite materials can be mechanically adjusted to reversibly modulate their reflectance and transmittance within the infrared region of the electromagnetic spectrum. In many such embodiments, the composite materials can be made to reversibly alter their thermoregulatory properties to resemble those of various common wearable materials, such as the space blanket, Omniheat lining, acrylic textile, and cotton. In many embodiments, the composite materials behave like mechanically-actuated radiative thermal switches and possess a highly-desirable and unprecedented combination of metrics, including manufacturability over large areas, a straightforward actuation method, reversibility and tunability without hysteresis, stability to repeated cycling, a soft and flexible form factor, rapid response time, high on/off ratios, and a low operating temperature. In many embodiments, the composite materials can manage the trapping and release of over one quarter of the thermal flux expected for an average human body at rest (and potentially more at higher strains), while requiring a small instantaneous energy input for switching of their thermoregulatory properties. In many embodiments, the composite materials possess a large dynamic environmental temperature setpoint range and allow users to precisely control their local thermal envelope when used in wearable applications. In many embodiments, the composite materials with adjustable spectral properties are manufactured from low-cost commercial building blocks via facile and scalable processes.

Of course, it should be understood that many types of platforms using IR-radiation can benefit from incorporating the composite materials with adjustable spectral properties discussed here, not just the thermoregulating clothing or clothing components. For example, in many embodiments, the composite materials can be used in applications related to night-vision camouflage, aircraft/spacecraft components, medical devices, and shipping/storage containers, flexible/stretchable devices, conformable electronic skin, and untethered soft robots, among others. More generally, it should be understood, that the composite materials of embodiments can be implemented in any applications where it is desirable to have adjustable IR-reflecting properties in accordance with embodiments of the invention and that the disclosure is not limited to implementing thermoregulatory wearables. In general, as can be inferred from the above discussion, the above-mentioned concepts can be implemented in a variety of arrangements in accordance with embodiments of the invention. Accordingly, although the present invention has been described in certain specific aspects, many additional modifications and variations, including different choices of materials used in fabrication of the composite materials of embodiments would be apparent to those skilled in the art. It is therefore to be understood that the present invention may be practiced otherwise than specifically described. Thus, embodiments of the present invention should be considered in all respects as illustrative and not restrictive.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A composite material with adjustable spectral properties comprising:
   an elastomeric matrix characterized by an elastomer thickness and comprising an IR-transparent, flexible, and stretchable material characterized by an elastic modulus;
   a plurality of micro-domains overlaying the elastomeric matrix, the plurality of micro-domains being characterized by a micro-domain thickness and comprising an IR-reflecting material;
   a plurality of spacings, separating the plurality of micro-domains, the plurality of spacings comprising the elastomeric matrix having no overlaid IR-reflecting material;
   wherein the plurality of spacings is dynamically adjustable via mechanical manipulations of the elastomeric matrix.

2. The composite material of claim 1, wherein the elastomer thickness is less than 300 microns.

3. The composite material of claim 1, wherein the elastic modulus is $<10^2$ MPa.

4. The composite material of claim 1, wherein the IR-transparent, flexible, and stretchable material is selected from the group consisting of: polyethylene, polyurethane, polypropylene, polycarbonate, any block co-polymer with polystyrene, such as styrene-isoprene-styrene, styrene-butylene-styrene, or styrene-ethylene-butylene-styrene block co-polymer, or any combination thereof; a metal, a metal or non-metal oxide, such as Cu, Al, $TiO_2$, or $SiO_2$, a ceramic, alloys thereof, or any combination thereof.

5. The composite material of claim 1, wherein the micro-domain thickness is one of either: 2 to 100 nm or 20 nm.

6. The composite material of claim 1, further comprising, a plurality of nanostructures anchoring the plurality of micro-domains into the elastomeric matrix, the plurality of nanostructures being characterized by a nanostructure height that is not included in the micro-domain thickness.

7. The composite material of claim 6, wherein the plurality of micro-domains is anchored into the elastomeric matrix via a plurality of nanostructures characterized by a nanostructure height that is not included in the micro-domain thickness.

8. The composite material of claim 6, wherein the IR-transparent, flexible, and stretchable material is functionalized with chemical groups that bind the IR-reflecting material.

9. The composite material of claim 1, wherein the nanostructure height is one of either less than 1 micron or approximately 90 nm.

10. A method of fabricating a composite material with adjustable spectral properties comprising:
    providing a support substrate;
    depositing a first sub-layer of an IR-reflecting material characterized by a planar layer thickness on top of the support substrate such that the first sub-layer of the IR-reflecting material is immediately adjacent to the support substrate and comprises the IR-reflecting material deposited into a continuous featureless layer capable of reflecting IR radiation;
    depositing a layer characterized by an elastomer thickness of an IR-transparent elastomeric material characterized by an elastic modulus on top of the deposited IR-reflecting material to form a composite comprising the IR-reflecting material and an IR-transparent elastomeric matrix;
    adhering the IR-reflecting material and the IR-transparent elastomeric matrix;
    delaminating the composite from the support substrate with application of force, such that the first sub-layer breaks into a plurality of micro-domains comprising IR-reflecting material surrounded by a plurality of spacings comprising the uncoated IR-transparent elastomeric matrix,
    to produce a free standing film of the composite material with adjustable spectral properties.

11. The method of claim 10, wherein the IR-transparent elastomeric material is cured, or otherwise heat or time-treated prior to delamination.

12. The method of claim 10, wherein the IR-reflecting material is deposited onto the substrate support via electron-beam evaporation, or physical or chemical vapor deposition technique.

13. The method of claim 10, wherein the support substrate is selected from the group consisting of: silicon wafer, aluminum foil, polymer, or glass.

14. The method of claim 10, wherein the planar layer thickness is one of either 2-100 nm or 20 nm.

15. The method of claim 10, further comprising: depositing a second sub-layer of the IR-reflecting material on top of and immediately adjacent to the first sub-layer and prior to depositing the layer of the IR-transparent elastomeric material, such that the second sub-layer comprises a plurality of nanostructures characterized by a nanostructure height, and such that depositing the layer of the IR-transparent elastomeric material buries the plurality of nanostructures into the IR-transparent elastomeric matrix, thus anchoring the first sub-layer into the IR-transparent elastomeric matrix to form the composite comprising the IR-reflecting material securely embedded into an IR-transparent elastomeric matrix.

16. The method of claim 10, wherein the plurality of nanostructures comprises an array of nanostructures of a shape selected from the group consisting of: vertical or tilted columns, zig-zags, helices, blades, stacks of alternating thickness, or any combination thereof.

17. The method of claim 10, wherein the nanostructure height is one of either less than 1 micron or approximately 90 nm.

18. The method of claim 10, wherein the IR-reflecting material is selected from the group consisting of: polyethylene, polyurethane, polypropylene, polycarbonate, any block co-polymer with polystyrene, such as styrene-isoprene- styrene, styrene-butylene-styrene, or styrene-ethylene-butylene-styrene block co-polymer, or any combination thereof, a metal, a metal or non-metal oxide, such as Cu, Al, $TiO_2$, $SiO_2$, a ceramic, alloys thereof, or any combination thereof.

19. The method of claim 10, wherein the IR-transparent elastomeric matrix is deposited via a method selected from the group consisting of: spin coating, spray coating, slot-casting, offset printing, blade coating, melt blowing, printing, extrusion, gravure coating, laminating, or any combination thereof.

20. The method of claim 10, wherein the elastomer thickness is less than 300 microns.

21. The method of claim 10, wherein the elastic modulus is $<10^2$ MPa.

22. A method for controlling IR radiation emitted by an object or body comprising:
  enveloping the object or body emitting IR radiation in a composite material with adjustable spectral properties comprising:
    an elastomeric matrix characterized by an elastomer thickness and comprising an IR-transparent, flexible, and stretchable material characterized by an elastic modulus,
    a plurality of micro-domains overlaying the elastomeric matrix, the plurality of micro-domains being characterized by a micro-domain thickness and comprising an IR-reflecting material,
    a plurality of spacings separating the plurality of micro-domains, the plurality of spacings comprising the elastomeric matrix having no overlaid IR-reflecting material, and
    a plurality of nanostructures anchoring the plurality of micro-domains into the elastomeric matrix, the plurality of nanostructures being characterized by a nanostructure height that is not included in the micro-domain thickness,
    wherein the plurality of spacings is dynamically adjustable via mechanical manipulations of the elastomeric matrix; and
  mechanically manipulating the elastomeric matrix in a controlled manner to adjust the plurality of spacings between the plurality of micro-domains to release or contain IR radiation emitted by the object or body.

23. The method of claim 22, wherein IR radiation is heat.

24. The method of claim 22, wherein the mechanical manipulation is achieved via a method selected from the group consisting of: application of strain, shearing, pressure, flexing, twisting, bending, or any combination thereof.

* * * * *